United States Patent
Cabauy

(10) Patent No.: US 11,200,997 B2
(45) Date of Patent: Dec. 14, 2021

(54) SEMICONDUCTOR DEVICE WITH EPITAXIAL LIFTOFF LAYERS FOR DIRECTLY CONVERTING RADIOISOTOPE EMISSIONS INTO ELECTRICAL POWER

(71) Applicant: CITY LABS, INC., Miami, FL (US)

(72) Inventor: Peter Cabauy, Miami, FL (US)

(73) Assignee: CITY LABS, INC., Miami, FL (US)

( * ) Notice: Subject to any disclaimer, the term of this patent is extended or adjusted under 35 U.S.C. 154(b) by 0 days.

(21) Appl. No.: 16/835,219

(22) Filed: Mar. 30, 2020

(65) Prior Publication Data
US 2020/0279666 A1 Sep. 3, 2020

Related U.S. Application Data

(63) Continuation-in-part of application No. 16/252,698, filed on Jan. 20, 2019, now Pat. No. 10,607,744.
(Continued)

(51) Int. Cl.
*G21H 1/00* (2006.01)
*G21H 1/06* (2006.01)
(Continued)

(52) U.S. Cl.
CPC .......... *G21H 1/06* (2013.01); *H01L 31/02161* (2013.01); *H01L 31/02327* (2013.01);
(Continued)

(58) Field of Classification Search
CPC ........... H01L 31/0304; H01L 31/02161; H01L 31/02327; H01L 31/03046; H01L 31/1844; H01L 31/1892; G21H 1/06
See application file for complete search history.

(56) References Cited

U.S. PATENT DOCUMENTS 2,745,973 A 5/1956 Rappaport
2,976,433 A 4/1961 Rappaport
(Continued)

FOREIGN PATENT DOCUMENTS

EP 1209549 3/2005

OTHER PUBLICATIONS

V.M. Andreev, et al, "Tritium-powered betacells based on AlxGA1-xAs" IEEE p. 1253-1256, 2000.
(Continued)

*Primary Examiner* — Phuc T Dang
(74) *Attorney, Agent, or Firm* — John L. DeAngelis; Wolter, Van Dyke, Davis, PLLC

(57) ABSTRACT

A device for producing electricity. In one embodiment, the device comprises a doped germanium or a doped GaAs substrate and a plurality of stacked material layers (some of which are doped) above the substrate. These stacked material layers, which capture beta particles and generate electrical current, may include, in various embodiments, GaAs, InAlP, InGaP, InAlGaP, AlGaAs, and other semiconductor materials. A radioisotope source generates beta particles that impinge the stack, create electron-hole pairs, and thereby generate electrical current. In another embodiment the device comprises a plurality of epi-liftoff layers and a backing support material. The devices can be connected in series or parallel.

9 Claims, 17 Drawing Sheets

Related U.S. Application Data which is a continuation of application No. 15/790,713, filed on Oct. 23, 2017, now Pat. No. 10,186,339, which is a continuation-in-part of application No. 14/623,861, filed on Feb. 17, 2015, now Pat. No. 9,799,419.

(60) Provisional application No. 61/940,571, filed on Feb. 17, 2014.

(51) Int. Cl.
*H01L 31/0232* (2014.01)
*H01L 31/0304* (2006.01)
*H01L 31/0216* (2014.01)
*H01L 31/115* (2006.01)
*H01L 31/18* (2006.01)

(52) U.S. Cl.
CPC .... *H01L 31/0304* (2013.01); *H01L 31/03046* (2013.01); *H01L 31/115* (2013.01); *H01L 31/184* (2013.01); *H01L 31/1844* (2013.01); *H01L 31/1892* (2013.01)

(56) References Cited

U.S. PATENT DOCUMENTS

| | | | |
|---|---|---|---|
| 2,998,550 | A | 8/1961 | Collins et al. |
| 3,278,811 | A | 10/1966 | Mori |
| 3,714,474 | A | 1/1973 | Hoff, Jr. |
| 4,020,003 | A | 4/1977 | Steinberg |
| 4,158,286 | A | 6/1979 | Reinberg |
| 4,275,405 | A | 6/1981 | Shannon |
| 4,291,815 | A | 9/1981 | Gordon |
| 5,260,621 | A | 11/1993 | Little |
| 5,642,014 | A | 6/1997 | Hillenius |
| 5,668,048 | A | 9/1997 | Kondo et al. |
| 5,777,462 | A | 7/1998 | Yue |
| 5,859,484 | A | 1/1999 | Mannik |
| 6,118,204 | A | 9/2000 | Brown |
| 6,238,812 | B1 | 5/2001 | Brown et al. |
| 6,281,426 | B1 | 9/2001 | Olson et al. |
| 6,407,929 | B1 | 6/2002 | Hillenius |
| 6,479,919 | B1 | 11/2002 | Aselage et al. |
| 6,660,928 | B1 | 12/2003 | Patton |
| 6,744,078 | B2 | 6/2004 | Fukuhara |
| 6,798,177 | B1 | 9/2004 | Liu |
| 6,949,865 | B2 | 9/2005 | Gadeken |
| 6,970,362 | B1 | 11/2005 | Chakravorty |
| 6,998,692 | B2 | 2/2006 | Sanchez |
| 7,122,733 | B2 | 10/2006 | Narayanan |
| 7,154,760 | B2 | 12/2006 | Konishi |
| 7,250,323 | B2 | 7/2007 | Gadeken |
| 7,301,254 | B1 | 11/2007 | Lal et al. |
| 7,336,509 | B2 | 2/2008 | Tallum |
| 7,411,283 | B2 | 8/2008 | Kockanson |
| 7,663,288 | B2 | 2/2010 | Chandrashekhar et al. |
| 7,939,986 | B2 | 5/2011 | Chandrashekhar et al. |
| 8,017,412 | B2 | 9/2011 | Spencer et al. |
| 8,134,216 | B2 | 3/2012 | Spencer |
| 8,153,453 | B2 | 4/2012 | Spencer et al. |
| 8,487,507 | B1 | 7/2013 | Cabauy et al. |
| 8,653,715 | B1* | 2/2014 | Baumbaugh .......... G21H 1/02 310/305 |
| 2001/0031572 | A1 | 10/2001 | Miwa |
| 2003/0145884 | A1 | 8/2003 | King et al. |
| 2004/0154656 | A1 | 8/2004 | Weaver |
| 2005/0274411 | A1 | 12/2005 | King et al. |
| 2006/0061922 | A1 | 3/2006 | Mihai |
| 2006/0185725 | A1 | 8/2006 | Fatemi et al. |
| 2007/0080605 | A1 | 4/2007 | Chandrashekhar et al. |
| 2008/0257409 | A1 | 10/2008 | Li et al. |
| 2009/0026879 | A1 | 1/2009 | Prelas |
| 2011/0031572 | A1 | 2/2011 | Spencer et al. |
| 2011/0079791 | A1 | 4/2011 | Chandrashekhar et al. |
| 2011/0083722 | A1* | 4/2011 | Atwater ............... H01L 31/184 136/246 |
| 2011/0086456 | A1 | 4/2011 | Spencer et al. |
| 2011/0114171 | A1 | 5/2011 | Meier et al. |
| 2011/0186115 | A1 | 8/2011 | Wanlass et al. |
| 2011/0241144 | A1 | 10/2011 | Spencer et al. |
| 2011/0287567 | A1 | 11/2011 | Spencer et al. |
| 2011/0298071 | A9 | 12/2011 | Spencer et al. |
| 2012/0133244 | A1 | 5/2012 | Spencer et al. |
| 2012/0149142 | A1 | 6/2012 | Spencer et al. |
| 2012/0288799 | A1* | 11/2012 | Takase ............... H01J 37/3177 430/296 |
| 2013/0074934 | A1 | 3/2013 | Liu et al. |
| 2013/0228216 | A1 | 9/2013 | Cornfeld |
| 2013/0278109 | A1 | 10/2013 | Zafiropoulo et al. |

OTHER PUBLICATIONS

FK. Manasse et al. "Schottky Barrier Betavoltaic Battery" IEEE Transactios on Nuclear Science, vol. NS-23, No. 1, pp. 860-870, Feb. 1976.

T. Kosteski, et al. "Tritiated Amorphous Silicon Betavoltaic Devices" IEEE Proceedings on Circuits, Devices & Systems, vol. 150, No. 4, pp. 274-281, Aug. 2003.

C. Hosberg et al. "GaN Betavoltaic Energy Converters" 31St IEEE Photovoltaics Specialist Conference, Jan. 2005.

Bower, Barbanel, Shreter, Bohnert; Reference book entitled Polymers Phosphors, Voltaics Radioisotope Microbatteries, Published by CRC Press, LLC, 2000 Corporate Bolevard NW, Boca Raton, FL 33431, USA; Copyright 2002, pp. 15-27.

Olsen, L.C. "Betavoltaic Energy Conversion". Energy Conversion V. 13, pp. 117-128; Fergusson Press, 1973.

L.C. Olsen, "Review of Betavoltaic Energy Conversion" In NASA Lewis Research Center, Proceedings of the 12th Space Photovoltaic Resrearch Center, Proceedings of the 12 Space Photovoltaic Research and Technology Conference (SPRAT 12) pp. 256-267.

\* cited by examiner

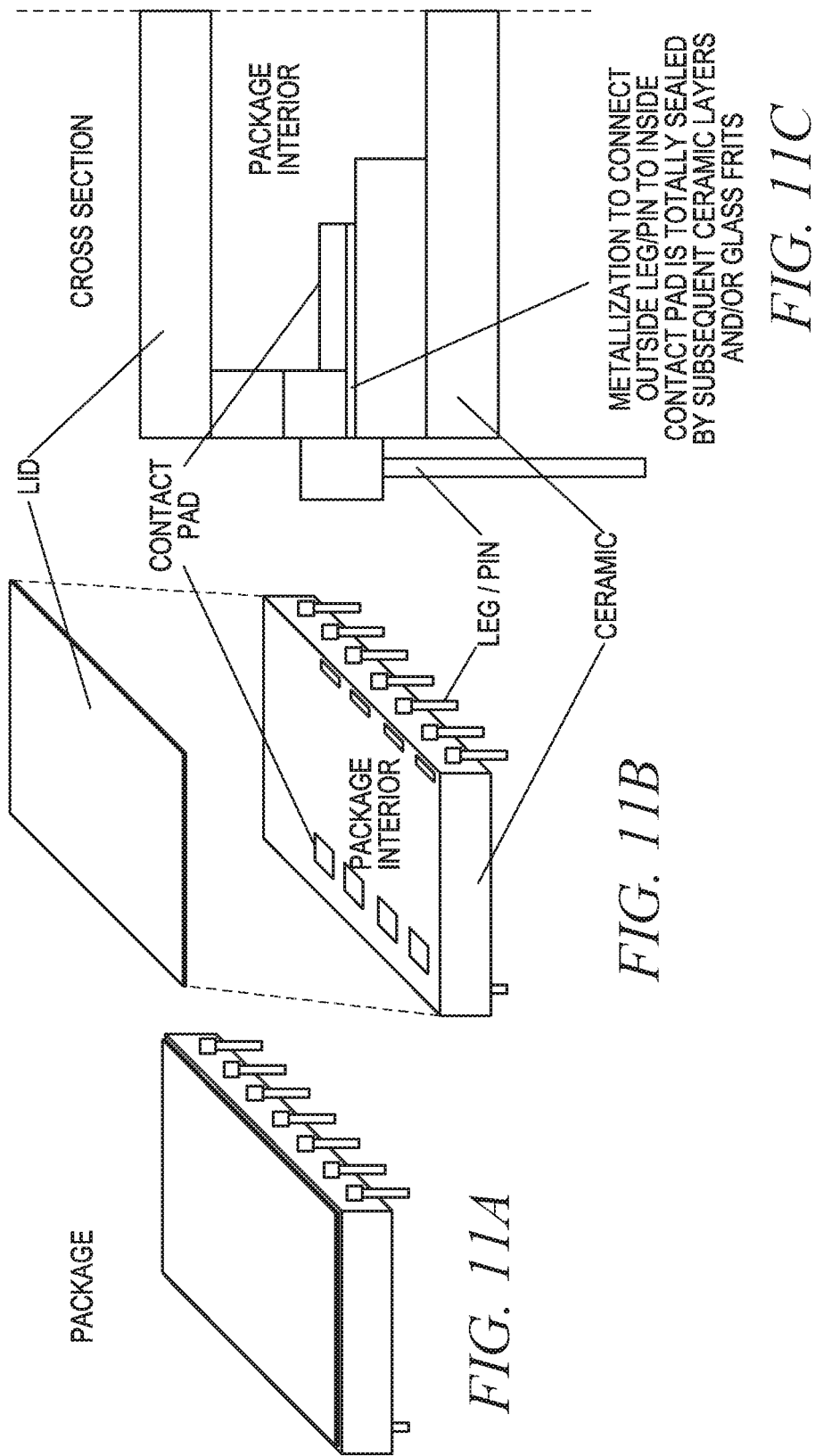

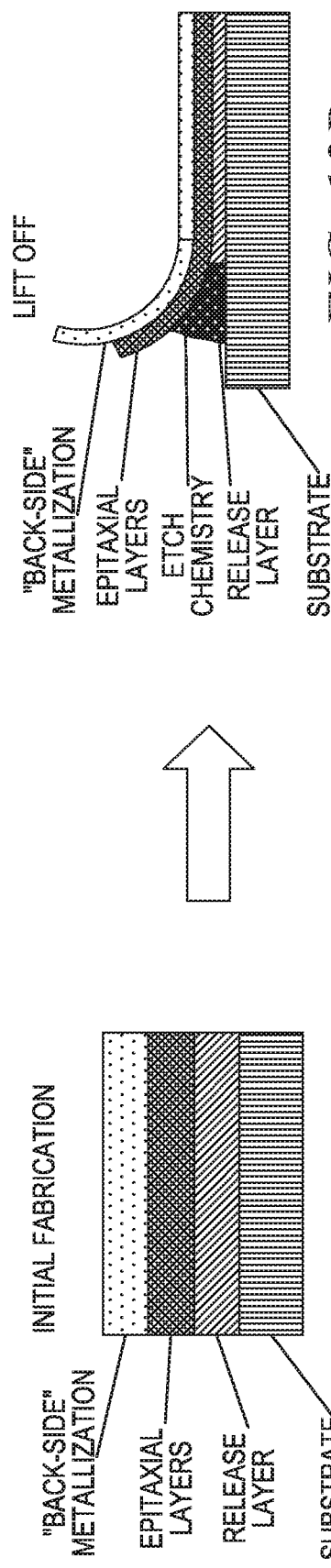
FIG. 13A
FIG. 13B
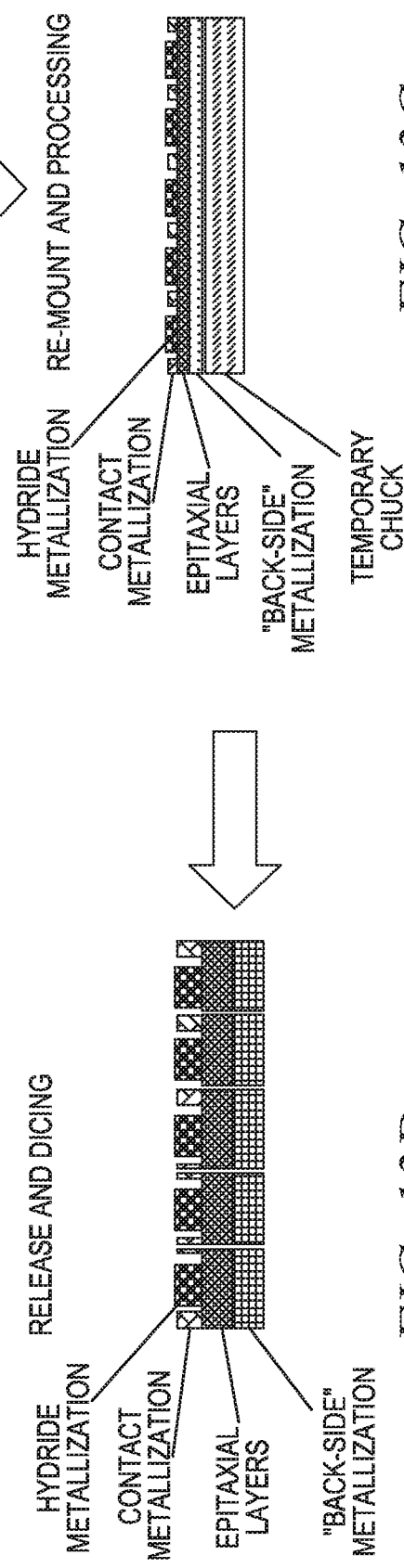
FIG. 13C
FIG. 13D

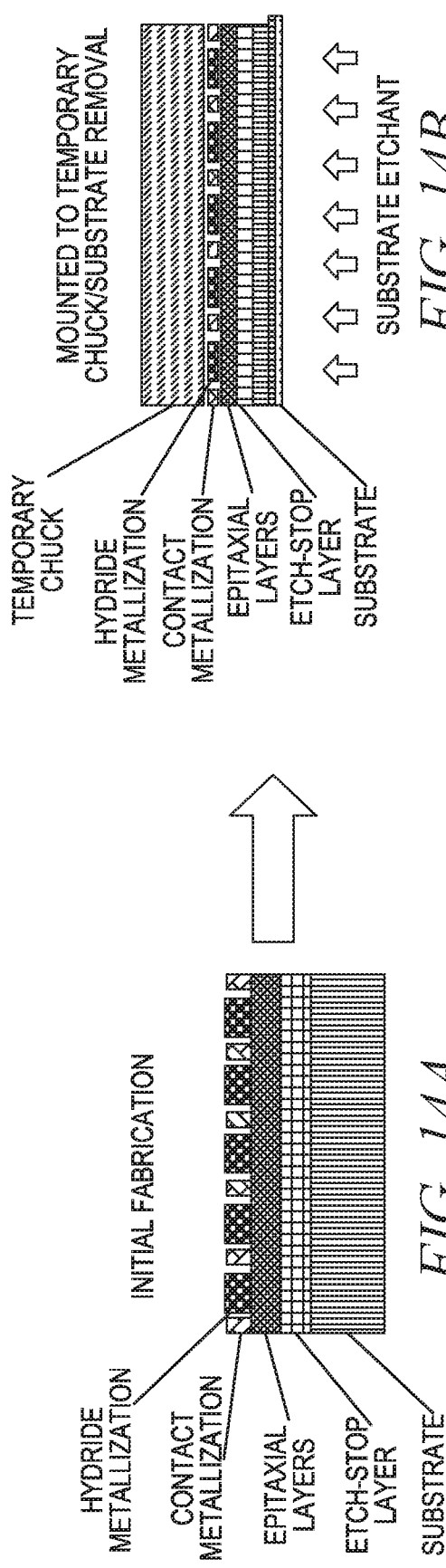
FIG. 14A
FIG. 14B
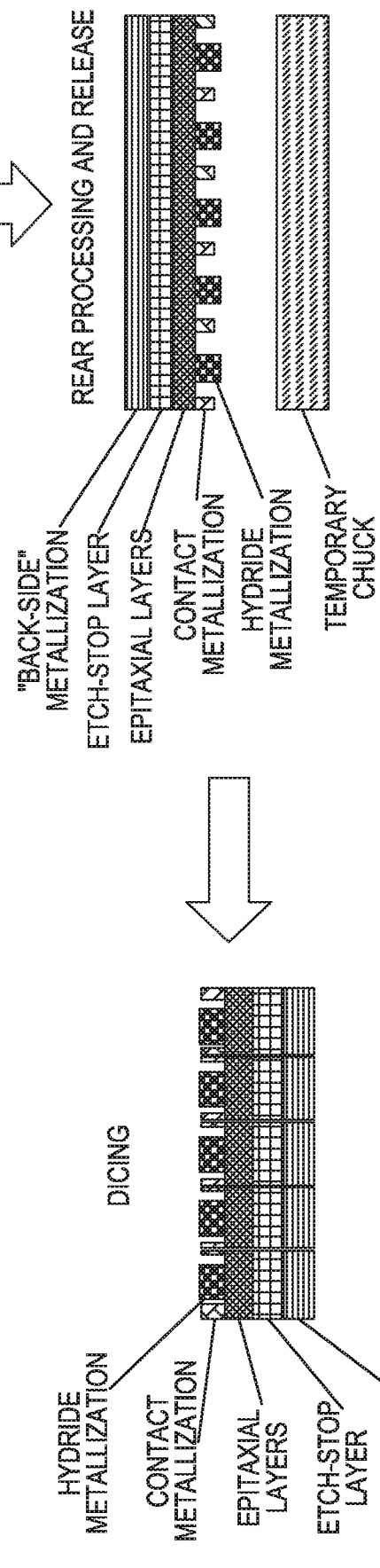
FIG. 14C
FIG. 14D

SEMICONDUCTOR DEVICE WITH EPITAXIAL LIFTOFF LAYERS FOR DIRECTLY CONVERTING RADIOISOTOPE EMISSIONS INTO ELECTRICAL POWER

CROSS REFERENCE TO RELATED APPLICATIONS

The present application is a continuation-in-part application, which claims priority to a continuation application Ser. No. 16/252,698, filed on Jan. 20, 2019, now U.S. Pat. No. 10,607,744, which in turn claims priority to the continuation-in-part application Ser. No. 15/790,713, filed on Oct. 23, 2017, now U.S. Pat. No. 10,186,339, which in turn claims priority to application Ser. No. 14/623,861, filed on Feb. 17, 2015, now U.S. Pat. No. 9,799,419, which claims priority under 35 U.S.C. 119(e) to the provisional patent application filed on Feb. 17, 2014 and assigned application No. 61/940,571. Each of these non-provisional applications and the provisional patent application are incorporated in their entirety herein.

BACKGROUND OF THE INVENTION

The direct conversion of radioisotope beta (electron) emissions into usable electrical power via beta emissions directly impinging on a semiconductor junction device was first proposed in the 1950's. Incident beta particles absorbed in a semiconductor create electron-hole-pairs (EHPs) which are accelerated by the built-in field to device terminals, and result in a current supplied to a load. These devices are known as direct conversion semiconductor devices, beta cells, betavoltaic devices, betavoltaic batteries, isotope batteries, betavoltaic power sources, betavoltaic(s) etc. These direct conversion devices promise to deliver consistent long-term battery power for years and even decades. For this reason, many attempts have been made to commercialize such a device. However, in the hopes of achieving reasonable power levels, the radioisotope of choice often emitted unsafe amounts of high energy radiation that would either quickly degrade semiconductor device properties within the betavoltaic battery or the surrounding electronic devices powered by the battery. The radiated energy may also be harmful to operators in the vicinity of the battery.

As a result of these disadvantages, and in an effort to gain approval from nuclear regulatory agencies for these types of batteries, the choice for radioisotopes has been limited to low-energy beta (electron) emitting radioisotopes, such as nickel-63, promethium-147, or hydrogen-3 (tritium). Since promethium-147 is regulated more stringently and requires considerable shielding, whereas nickel-63 has a relatively low beta flux, tritium has emerged as a leading candidate for such a battery device.

Tritium betavoltaic batteries, sometimes referred to as tritium betavoltaic devices or tritium direct conversion devices, have been promoted during the last thirty years. Tritium is listed in various regulatory guideline documents as being in the low toxicity group of radioisotopes producing only low beta energy emissions that can be easily shielded with as little as a thin sheet of paper. Tritium has a long track record of commercial use in illumination devices such as EXIT signs in commercial aircraft, stores, school buildings and theatres. It is also widely used in gun sights and watch dials, making it an ideal power source for the direct conversion devices. Unfortunately, tritium's beta emissions are so low in energy that it is has been difficult to efficiently convert these emissions into usable electrical power for even the lowest power applications, such as powering an SRAM memory to prevent loss of stored data.

Several attempts have been made to produce useful current from a tritium betavoltaic battery. For example, polycrystalline or amorphous semiconductor devices have been considered for tritium betavoltaic batteries based on the assumption that such devices would allow batteries to be fabricated at a reduced cost. It is assumed that these devices could be manufactured in a thin-film like fashion and that tritium could be embedded within the polycrystalline or amorphous devices. However, this approach is extremely inefficient with respect to the beta energy emissions entering the semiconductor (less than about 1%). The main reason for this low semiconductor conversion efficiency is the high dark current that acts as a negative current relative to the current generated by the beta emissions. This high dark current competes with the betavoltaic current produced by collection of EHPs created via the tritium beta particles impinging on the semiconductor. In short, the polycrystalline and amorphous semiconductors have a high number of defects resulting in recombination centers for the EHPs, which in turn significantly reduce the betavoltaic current and lead to very low efficiency for the battery.

The best results for tritium betavoltaics have been achieved with single crystal semiconductor devices. Recent attempts have involved single crystalline semiconductor devices with a tritium source such as a tritiated polymer, aerogel or tritiated metal hydride placed in direct contact with a semiconductor junction device. Single crystalline semiconductors have longer carrier lifetimes and fewer defects resulting in much lower dark currents. Representative efficiencies for tritium betavoltaic batteries were published in a reference text entitled: "Polymers, Phosphors and Voltaics for Radioisotope Microbatteries" edited by K. Bower et al. Single crystal semiconductor devices were exposed to tritium metal hydride sources on top of the semiconductors. Several homojunction (e.g., a conventional junction occurring at the interface between an n-type (donor doped) and p-type (acceptor doped) semiconductor, such as silicon, also referred to as a p-n junction) semiconductor cells were utilized with the following results:

Silicon Cells:
Short Circuit Current=18.1 nA/cm$^2$
Open Circuit Voltage=0.162
Fill Factor=0.513
Tritiated Titanium Source=0.23 microwatts/cm$^2$
Efficiency=1.3%
Aluminum Gallium Arsenide (AlGaAs) Cells:
Short Circuit Current=58 nA/cm$^2$
Open Circuit Voltage=0.62
Fill Factor=0.751,
Power=27 nW/cm$^2$
Tritiated Titanium Source=0.48 microwatts/cm$^2$,
Efficiency=5.6%

Silicon cells are a preferred choice due to their low cost. However, their low efficiency makes them a poor choice for even the lowest power applications, such as for use in SRAM memory devices. The performance of the AlGaAs homojunction cell is attractive with one of the higher reported efficiencies and would be suitable for powering an SRAM memory device, in particular by stacking of tritiated metal hydride layers and AlGaAs homojunction cells. However, AlGaAs homojunctions cells are difficult to reproduce consistently with uniform dark currents across a semiconductor device due to the oxidation of the aluminum. As a result, AlGaAs is also an expensive option to scale up.

Safety concerns over containment of the tritium based betavoltaic battery have emerged as another obstacle to commercialization of a tritium battery. In commercially available products such as tritium illumination devices (e.g. EXIT signs, gun sights and watch dials), the tritium is in gaseous form and contained within a glass vial. Many accidents involving tritium release due to the breakage of the tritium vials in EXIT signs have caused public concerns and resulted in costly clean-up operations. The use of hermetically sealed packages has reduced these concerns somewhat.

A tritium betavoltaic battery utilizing solid-state tritium metal hydride sources presents a lower exposure risk than gaseous tritium devices. However, the solid-state tritium metal hydride still involves a miniscule amount of tritium release when open to the environment at room temperature. Although several tritium based batteries have been proposed including direct conversion devices built within an integrated circuit, a method of effectively hermetically packaging the battery containing the tritium metal hydride continues to be problematic.

A major obstacle to hermetically sealing this type of battery is the risk associated with using a sealing process that involves high temperatures, i.e., above 200-300° C. At these temperatures, tritium is released from the metal hydride, possibly leading to battery failure after sealing, or worse, causing tritium exposure at the sealing manufacturing facility and to the operator of the sealing equipment.

The texturing of a direct conversion semiconductor device to increase the surface area exposed to radiation emission has been proposed several times in the past. For example, on page 282 of the book entitled "Polymers, Phosphors and Voltaics for Radioisotope Microbatteries" edited by K. Bower et al., the use of porous silicon and tritium inserted into porous silicon holes was proposed as a means of increasing the surface area of the semiconductor device by 20 to 50 times, in contrast to the original planar semiconductor surface area.

The following published patent applications and patents each propose a method of increasing the surface area of the semiconductor by textured growth of the semiconductor or a post-growth texturing method:
US Patent Application Publication 2004/0154656
US Patent Application Publication 2007/0080605
U.S. Pat. No. 7,250,323
U.S. Pat. No. 6,949,865

Central to this approach is the hope that an increase in surface area exposed to radioisotope emissions will increase the power per unit volume of the direct conversion semiconductor device. The goal of this approach is to not only reduce the size of the direct conversion device, but also to potentially reduce the cost associated with producing the equivalent surface area in a planar semiconductor device.

The problem with such an approach arises when a relatively low energy radioisotope such as tritium is used. In this case, the incident power is quite small per unit of exposed area and the dark current of the semiconductor device is a very significant factor in the overall efficiency. Unfortunately, alterations to the semiconductor surface risk increasing lattice defects, resulting in a high number of recombination centers for EHPs. This creates a direct conversion semiconductor device with a low open circuit voltage and reduced short circuit current, with a resulting low overall efficiency.

Generally, it is preferable to use a single crystal semiconductor material where device defects are minimized and the dark current is sufficiently low so that power can be efficiently produced.

BRIEF DESCRIPTION OF THE DRAWINGS

The present invention can be more easily understood and the advantages and uses thereof more readily apparent when the detailed description of the present invention is read in conjunction with the figures wherein:

FIGS. 11A-11C illustrate several views of a package for sealing a betavoltaic battery of the present invention.

FIGS. 13A-13D illustrate steps associated with an epitaxial lift-off (ELO) process.

FIGS. 14A-14D illustrate steps associated with a substrate removal process.

In accordance with common practice, the various described features are not drawn to scale, but are drawn to emphasize specific features relevant to the invention. Like reference characters denote like elements throughout the figures and text.

DETAILED DESCRIPTION OF THE INVENTION

Before describing in detail the particular methods and apparatuses related to tritium direct conversion semiconductor devices, it should be observed that the present invention resides primarily in a novel and non-obvious combination of elements and process steps. So as not to obscure the disclosure with details that will be readily apparent to those skilled in the art, certain conventional elements and steps have been presented with lesser detail, while the drawings and the specification describe in greater detail other elements and steps pertinent to understanding the invention.

The following embodiments are not intended to define limits as to the structure or method of the invention, but only to provide exemplary constructions. The embodiments are permissive rather than mandatory and illustrative rather than exhaustive.

The present invention is described in the context of a tritium direct conversion semiconductor device comprising a single crystal semiconductor. In preferred embodiments, the device exhibits a relatively low dark current and relatively high efficiency for the conversion of tritium's beta emissions into electrical power. It should be understood that the high efficiency and longevity (e.g. over 10 years) of the various device structure embodiments can also be attained using other candidate radioisotopes (e.g., promethium-147 and nickel-63), or combinations of radioisotopes, wherein the end-product is an electron or beta particle that impinges on a semiconductor material. Such devices can be formed on various substrate materials, such as gallium arsenide and germanium.

Figure 1:
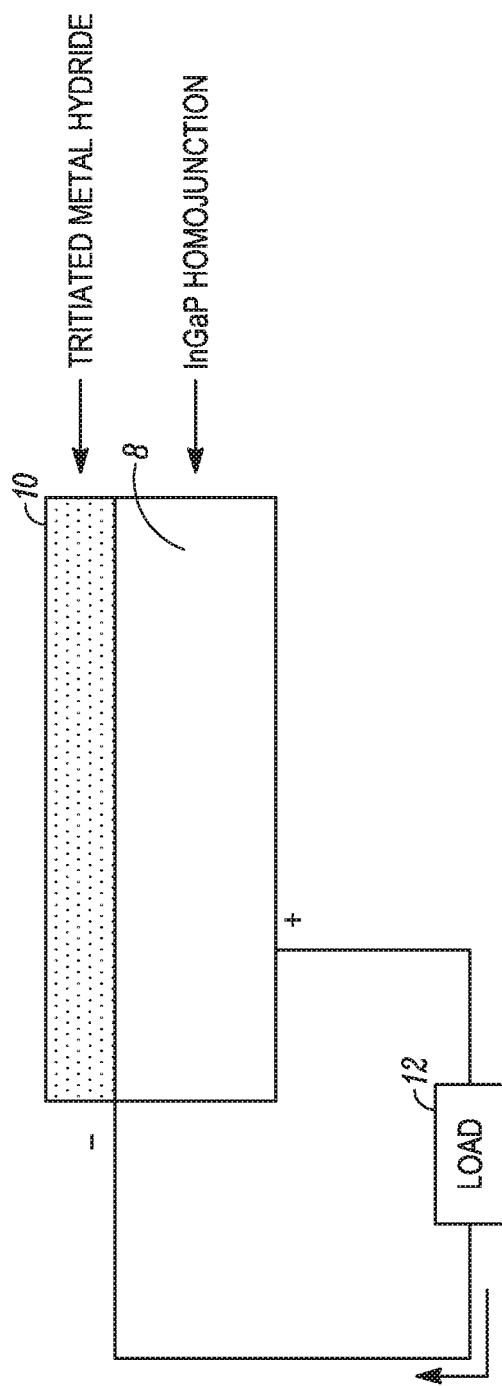
FIG. 1 is a representation of an InGaP homojunction in contact with a tritiated metal hydride source connected to a load.

One embodiment of the present invention proposes a novel use of an Indium Gallium Phosphide (InGaP) homojunction semiconductor 8 (also referred to as a betavoltaic junction, and comprising a plurality of doped semiconductor layers) in conjunction with a tritiated metal hydride source 10, as illustrated in FIG. 1, for supplying power to a load 12. The tritiated metal hydride source (e.g., scandium tritide, titanium tritide, palladium tritide, magnesium tritide, lithium tritide, or any combination thereof etc.) is in direct contact with (or proximate to) the semiconductor to generate electrical power at an efficiency of 7.5% or higher with respect to the beta electrons impinging on the Indium Gallium Phosphide homojunction. InGaP is one of the larger band gap materials and therefore can be advantageously used in a betavoltaic battery. Generally, when used in the present written description, proximate refers to a near or close physical relationship, including physical contact, between two elements. The dimensions of a proximate relationship depend on the scale of the elements in the proximate relationship. Further, when two elements are described as proximate, there may be one or more intervening elements or no intervening elements.

One embodiment of the concept illustrated in FIG. 1 uses a composition of the Indium Gallium Phosphide homojunction comprising $In_{0.49} Ga_{0.51} P$ (subsequently referred to as InGaP). The band gap of this semiconductor is 1.9 eV and the materials production technology has been well developed by the solar cell industry. The technology also lends itself to high quality growth with a low density of lattice defects and low dark current characteristics. In addition, InGaP may be mass produced with a high yield due to the maturity of its manufacturing processes, thus lowering the cost of tritium betavoltaic batteries based on the InGaP homojunction. InGaP, (and other III-V device structures) may be grown by metal-organic-chemical-vapor-deposition (MOCVD), molecular beam epitaxy (MBE), liquid phase epitaxy (LPE), or through other techniques known by those skilled in the art.

Figure 2:
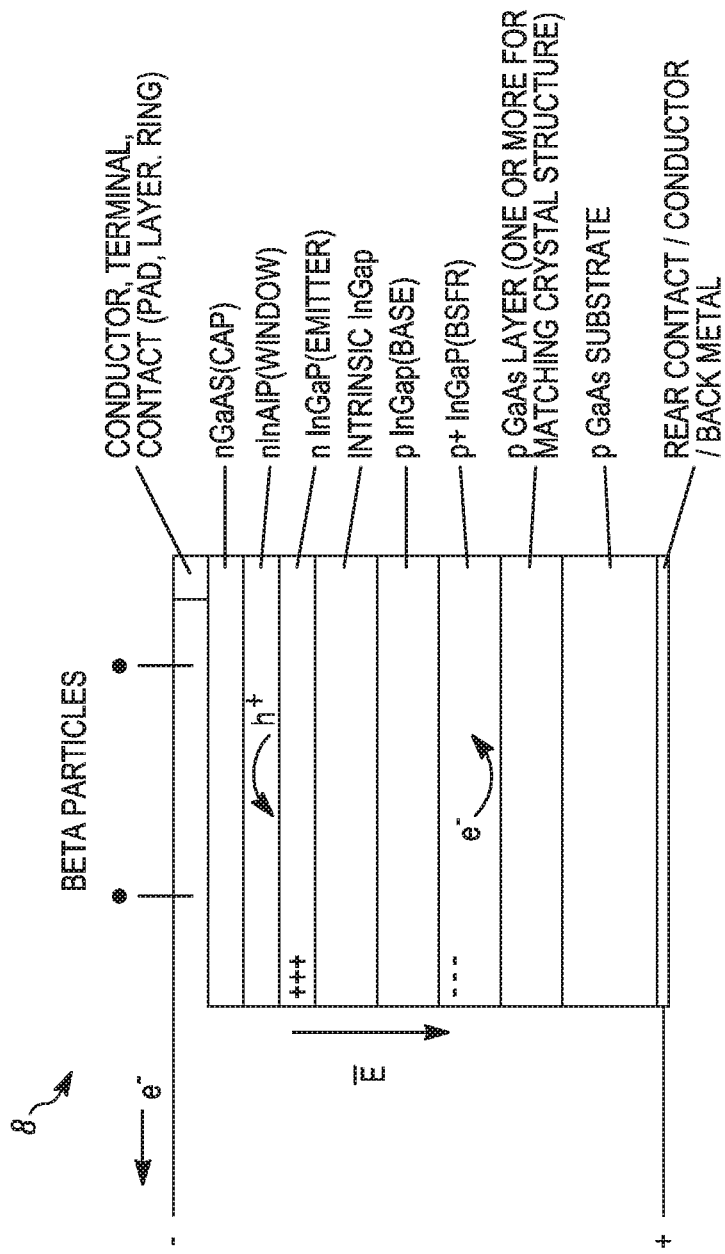
FIG. 2 illustrates a physical structure of an InGaP homojunction device for tritium betavoltaic conversion, illustrating the individual semiconductor layers.
Figure 3:
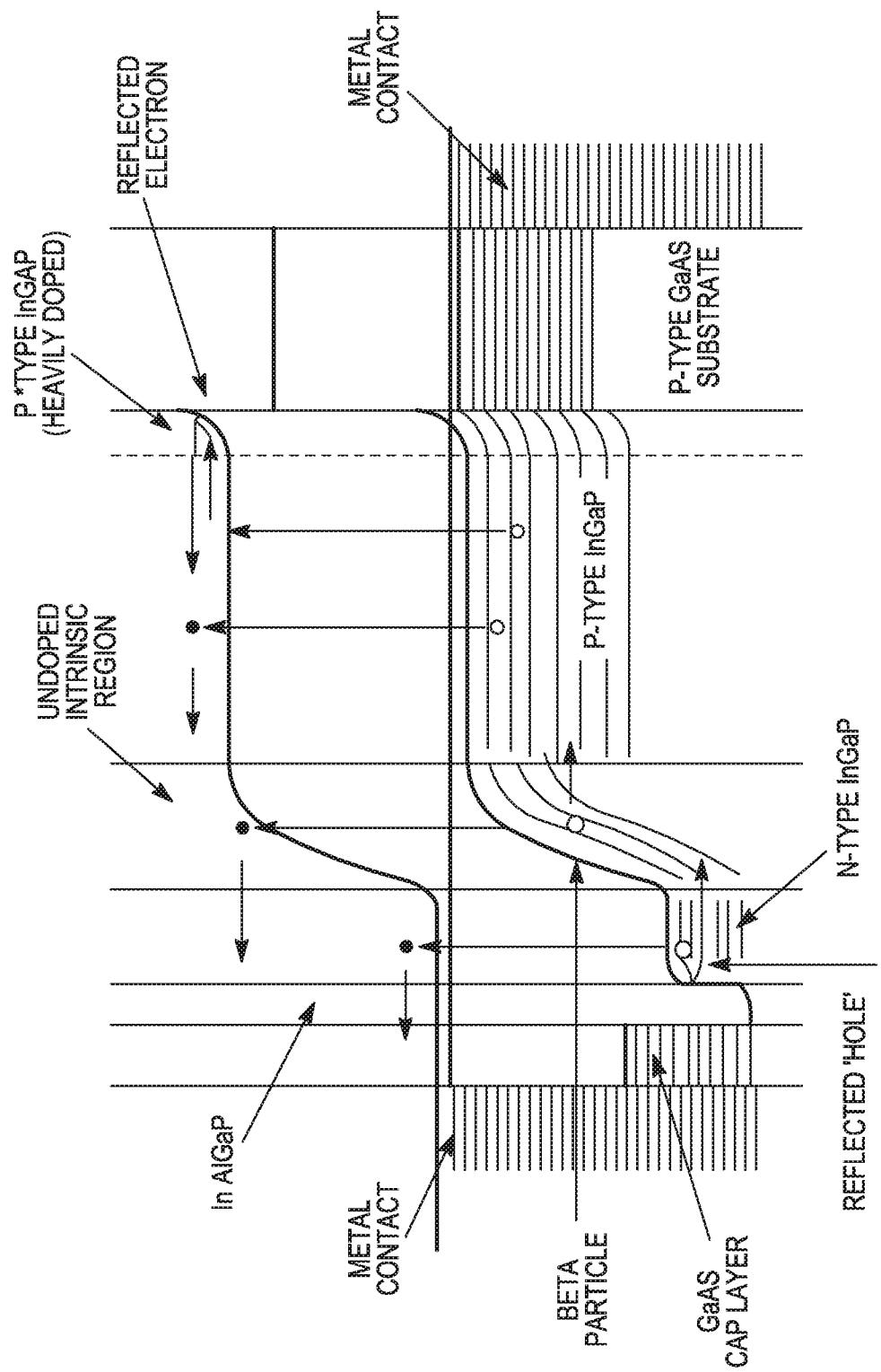
FIG. 3 is an electron band diagram for an InGaP device.

The embodiments described herein present novel and non-obvious features that allow efficient conversion of tritium beta flux into electrical power. FIGS. 2 and 3 illustrate the physical structure (doped layers) and electron band diagram, respectively. Each layer is lattice-matched to a doped gallium arsenide (GaAs) substrate (germanium can also be used as the substrate material, as described elsewhere herein) so that the number of dislocations generated by growth of the individual layers is minimized.

In general, beta particles radiate outward randomly in all directions from the source. The beta particles in FIG. 2 are released by the tritiated metal hydride source (shown in FIG. 1 but not in FIG. 2) and are represented by dots, whereas the arrowheads represent one direction of motion of the beta particles emanating from the source.

FIG. 2 illustrates the individual layers of the n/p homojunction semiconductor 8, comprising, from the bottom:
 a pGaAs substrate (notation for a p-type GaAs substrate)
 a pGaAs layer (one or more layers grown to establish a matching crystal structure)
 a p+InGaP layer (a back-surface field reflector or minority carrier reflector; this layer reflects electrons, i.e., minority carriers in a p-doped material)
 a pInGaP layer (base)
 an intrinsic InGaP layer (for preventing diffusion of dopants between the p-doped and n-doped layers)
 an nInGaP layer (emitter)
 an nInAlP layer (window layer having a lattice structure that is closely matched to the nInGaP below and the cap layer above that allows electrons to pass to the cap layer; this window layer reflects holes (i.e., minority carriers in an n-doped material) back to the emitter)
 an nGaAs cap layer (highly doped in one embodiment)

There are several features of this structure that allow efficient betavoltaic energy conversion:

(a) A high quality, large band gap semiconductor junction resulting in a highly efficient device; generally, any material having a band gap greater than about 1.8 eV is considered a large band gap in the context of this invention. InGaP is considered a wide bandgap material with a band gap of about 1.89 eV; the bandgap of InAlP is about 2.35 eV.

(b) A back-surface field reflector layer (in one embodiment a highly-doped p$^+$InGaP layer) that reflects electrons back onto the junction field. The back-surface field reflector layer can also be formed by p-type: InAlP, AlAs, AlAsP, InAlGaP, ZnSe, a pseudomorphic layer, or other materials known in the art.

(c) A lattice-matched n-type InAlP window layer that reflects holes (due to the presence of a small electric field) back to the emitter layer (to the junction), which also contributes to a desired low dark current. This window layer can also be formed with a highly-doped n+InAlGaP, ZnSe, AlAs, n+InGaP, AlAsP, a pseudomorphic layer, or other materials known in the art;

(d) A GaAs cap layer having a thickness of a few hundred Angstroms or less, and covering the top surface;

(e) a 1000 to 3000 Angstrom layer of intrinsic InGaP to act as a buffer to diffusion of the p-type base dopant (usually Zn) into the n-type emitter region.

The use of features (a), (b) and (c) in a tritium betavoltaic application is considered novel. The novel features (d) and (e) may be important for betavoltaic conversion, but they are not necessarily used for photovoltaic energy conversion. All of these features create a low dark current that is required for efficient betavoltaic energy conversion. The novel lattice-matched InAlP window layer (with a larger band gap) prevents the formation of dislocations at the InAlP (window)-InGaP (emitter) interface, which would increase the dark current. The GaAs cap layer prevents oxidation of the InAlP window layer, as this oxidation can introduce defects that provide sites for EHP recombination at the InAlP—InGaP region. This cap layer, therefore augments hole reflections at that interface. The GaAs cap layer does not absorb a significant percentage of the beta flux, and therefore its use can be tolerated. The cap layer material may comprise other group III-V materials or combinations of III-V materials that have similar functionality.

In one embodiment, the cap layer is about 50-500 Angstroms thick, or less. In one embodiment, the gridlines are first deposited on top of a thick (for example, about 3000 to 10000 Angstroms) cap layer and then the cap layer is removed by an etch process, that is, except for cap layer material under the grid lines. To retain a thinner portion of this cap layer material, the etch process can be timed so that about 50-500 Angstroms of cap layer material remains.

Alternatively, an etch stop layer can be formed and located such that when the etchant reaches the etch stop layer, about 50-500 Angstroms of cap layer material remains. For example, according to one method, a thin 50-500 Angstrom cap layer, for protecting the window, uses a selective etch of the GaAs cap layer that stops at a thin InGaP layer leaving a thin layer of InGaP over the 50-500 Angstrom GaAs cap layer, and if desired, the InGaP layer may then be selectively etched down to the GaAs cap layer.

In another embodiment, a thick cap layer (for example 500-10000 Angstroms or greater) may be grown, and a conductive contact material (e.g., metal contacts/gridlines/ring/terminals/pads/points/epoxy(s)/solders, etc.) may be placed or deposited on the thick cap layer. The cap layer may be chemically etched, physically ablated, or otherwise removed in areas of the device except areas under the conductive contacts. The removal of cap layer may be partial (resulting in a cap layer thickness that is less than the initial thickness) or complete (i.e. no cap layer remains except under the deposited contacts). Additionally, in some embodiments, the cap layer thickness may vary from location to location. Typically, a cap layer thickness of 500 Angstroms or less will permit a significant percentage of tritium betas to pass through.

In another embodiment, a thin cap layer (for example 50-500 Angstroms or less) may be grown, and a conductive contact(s) (e.g. metal contacts/gridlines/ring/terminals/pads/points/epoxy(s)/solders etc.) may be placed or deposited on the thin cap layer. This cap layer may be chemically etched, physically ablated, or otherwise removed on areas of the device except areas under the conductive contact(s). The removal of cap-layer may be partial (resulting in a cap layer thickness that is less than the initial thickness) or complete (i.e. no cap layer remains except under the deposited contacts) or its thickness may vary from location to location.

In another embodiment, the cap layer is not removed and is instead initially grown to the desired thickness prior to deposition of the conductive contact(s).

In yet another embodiment, a cap layer is not grown initially, or is entirely removed prior to deposition of conductive contact(s). In this embodiment, electrical contact is established with either the window or emitter layer using methods known to those skilled in the art.

In solar cell operation the GaAs cap layer is typically removed except under the metal gridline contacts. This is required since a cap layer across regions between the metal gridline contacts reduces the efficiency of the solar cell due to significant absorption of the solar photons. For this reason, the GaAs cap layer is etched away completely in a solar cell, except for the regions under the gridline metal contacts. Since in solar cell operation remaining segments of the GaAs cap layer under the metal gridlines serve as a conduit for electrons to reach the gridlines, the GaAs cap layer is normally doped to a high level (for example, $10^{19}$ ND/cm$^3$). This high doping level provides a good conductive path for current flow (i.e., in the range of milliamps or higher for good photovoltaic operation).

High doping of the GaAs cap may unfortunately create defects in the n-type InAlP window layer, which could increase the dark current. For betavoltaic operations, such a high doping level, the attendant defects, and the resulting increase in the dark current may reduce the overall efficiency of the betavoltaic cell. This is not important for photovoltaic operations since the dark current is so low compared to the milliamp current levels generated in a solar cell photovoltaic system, but it is extremely important for efficient betavoltaic operation, where the generated current levels are in the range of nanoamps. For this reason, the novel application of a cap layer with reduced doping may be used. Therefore, betavoltaic GaAs cap layer doping may be reduced to a level of $10^{18}$ ND/cm$^3$, or less, thereby reducing the number of defects that may result from diffusion of the GaAs cap layer dopants into the n-type InAlP window layer.

As known by those skilled in the art, generally when referring to dopant levels herein the optimum dopant level is typically a function of the material receiving the dopants and the dopant material. Dopant levels set forth herein are therefore merely exemplary, as other dopant levels may also result in a functional device, again, depending on the dopant material and the material receiving the dopants.

The novel intrinsic InGaP layer (between the base and emitter in FIG. 2) is not used in photovoltaic operation, but may be important for betavoltaic operation due to the fact that it helps achieve low dark currents. All layers of the device are grown at high temperatures (e.g. 500° C.-700° C.). In particular, the intrinsic layer, the n-InGaP emitter layer, the n-InAlP window layer and the n-GaAs cap layer are all grown at high temperatures. During the time required for growth of these layers, the p-type dopant zinc in the p-InGaP layer (base) will diffuse toward the n-type films. If the intrinsic layer is too thin and thereby allows zinc to diffuse into the emitter layer and the InAlP window layer, the dark current will increase and the betavoltaic device performance degraded. Thus, since low dark currents are critical for tritium betavoltaic energy conversion, the intrinsic layer must be thick enough to be an effective buffer to zinc diffusion. An intrinsic layer of approximately 1000-3000 Angstroms or more is sufficient to produce a low dark current in a betavoltaic device. However, in certain embodiments it is possible to remove the intrinsic layer or to use a substantially thinner intrinsic layer thickness of about e.g., 50-100 Angstroms.

In certain embodiments described herein, an intrinsic layer is disposed between the emitter (e.g., the nInGaP layer) and base (e.g., the pInGaP layer). See FIG. 2. The thickness of the intrinsic layer is selected so that most of the beta particle absorption occurs in the emitter and intrinsic layers.

In general, the intrinsic layer in tritium betavoltaic devices serves three important purposes: (a) it acts as a buffer to diffusion of dopant atoms from the base region into the emitter region; (b) it allows efficient collection of electron-hole pairs produced as a result of beta particle absorption; and (c) as a consequence, the base region can be heavily doped so that the built-in junction voltage can be maximized. The high dopant density in the base region (with reference to FIG. 2, the pInGaP base layer) is novel to the betavoltaic structure. This is due to the fact that it is not necessary to have a finite diffusion length in the base region for efficient carrier collection; hence a relatively high dopant density can be used in the base region to maximize the built-in potential. Minimizing diffusion of dopant atoms from the base to the emitter and window layers is desirable for achieving a low dark current. With EHPs mainly produced in the emitter and high-field intrinsic region, a large collection efficiency can be achieved.

Homojunctions are typically formed by abruptly reducing one dopant (e.g., for n-type material) and immediately introducing the other dopant (e.g., for p-type material). The intrinsic layer formed in devices discussed herein is created by reducing one dopant input to zero, followed by film growth with neither donors nor acceptors to form the intrinsic layer, and then introducing the other dopant type.

However, since the tritium betas are absorbed in a few thousand Angstroms, there is substantial flexibility regarding an increased doping density in the base. As the dopant density is increased in the base there is the risk of creating defects, but benefiting from a high field created across the intrinsic/emitter region, thereby raising the output voltage of the device.

It should be noted that the tritium InGaP betavoltaic structures described herein present novel and non-obvious features that provide a low dark current at a high voltage and collection efficiency. The following data was obtained with solid tritiated metal hydride sources (e.g. titanium tritide, scandium tritide, etc.) and one of the highest reported efficiencies of about 7.5% with respect to the incident beta radiation impinging on the InGaP homojunction. In particular, for a tritiated scandium source with a 250 to 500 nanometer thick scandium film and an InGaP homojunction as shown in FIG. 2, the following results were achieved:

Short Circuit Current=45.2 nA/cm^2
Open Circuit Voltage=0.77
Fill Factor=0.79,
Power=27.5 nW/cm^2
Tritiated Scandium Source=0.369 microwatts/cm^2,
Efficiency=7.5%

In yet another embodiment the dopants may be reversed for all layers to produce a p/n homojunction structure. In particular, starting from the bottom:

an nGaAs substrate
an nGaAs layer (grown to establish a crystal structure)
an n+InGaP layer (a back-surface field reflector or minority carrier reflector layer)
an nInGaP base layer
an intrinsic InGaP layer (for preventing diffusion of dopants between the p-doped and
n-doped layers)
a pInGaP emitter layer
a pInAlP window layer (preferably having a lattice structure closely matched to the lattice structure of the overlaying pInGaP emitter layer
that allows holes to pass to the cap layer and reflects electrons back to the emitter)
a pGaAs cap layer (may be highly doped p-type)

Tritium beta particle penetration in semiconductors is less than about one micron. Thus, it is clear that the emitter and window layers need to be very thin, preferably on the order of a few hundred Angstroms, so that most of the beta particle absorption occurs in the high electric field region of the depletion layer (with respect to FIG. 2, the high electric field region in the intrinsic InGaP layer or in an embodiment absent the intrinsic layer, the high field region between the p-doped base and an n-doped emitter).

In another embodiment, the InGaP betavoltaic structure may be alloyed with 1-3% aluminum to achieve a slightly higher band gap, resulting in a higher open circuit voltage. This structure may result in a higher efficiency. But efficiency must also consider material defects, the ideality factor (indicative of the extent to which performance of a betavoltaic device approaches an ideal diode), and form factor.

Without loss of generality, the various embodiments described for an InGaP betavoltaic structure (and more generally, all radioisotope direct energy conversion structures) discussed herein may be extended to betavoltaic structures that include InAlP, InAlGaP, GaAs, AlGaAs, and other Group III-V compounds. Any of these materials may be lattice-matched to GaAs and germanium (Ge) substrates, either by direct contact to the substrate or by use of an intervening lattice-matching layer.

The various structures described herein for use with InGaP betavoltaic junction materials (e.g., the cap layer, the window layer, the back-surface filed reflector layer, the intrinsic layer) are also relevant to semiconductor structures of InAlP, InAlGaP, GaAs, AlGaAs, and one or more other Group III-V materials. Certain of these materials may have a higher band gap than InGaP.

As shown in one or more of the tables below, in certain betavoltaic structures one or more layers may comprise InGaP material (the base layer for example) and one or more other layers in the structure may comprise InAlP material (the reflector layer, for example).

Figure 4:
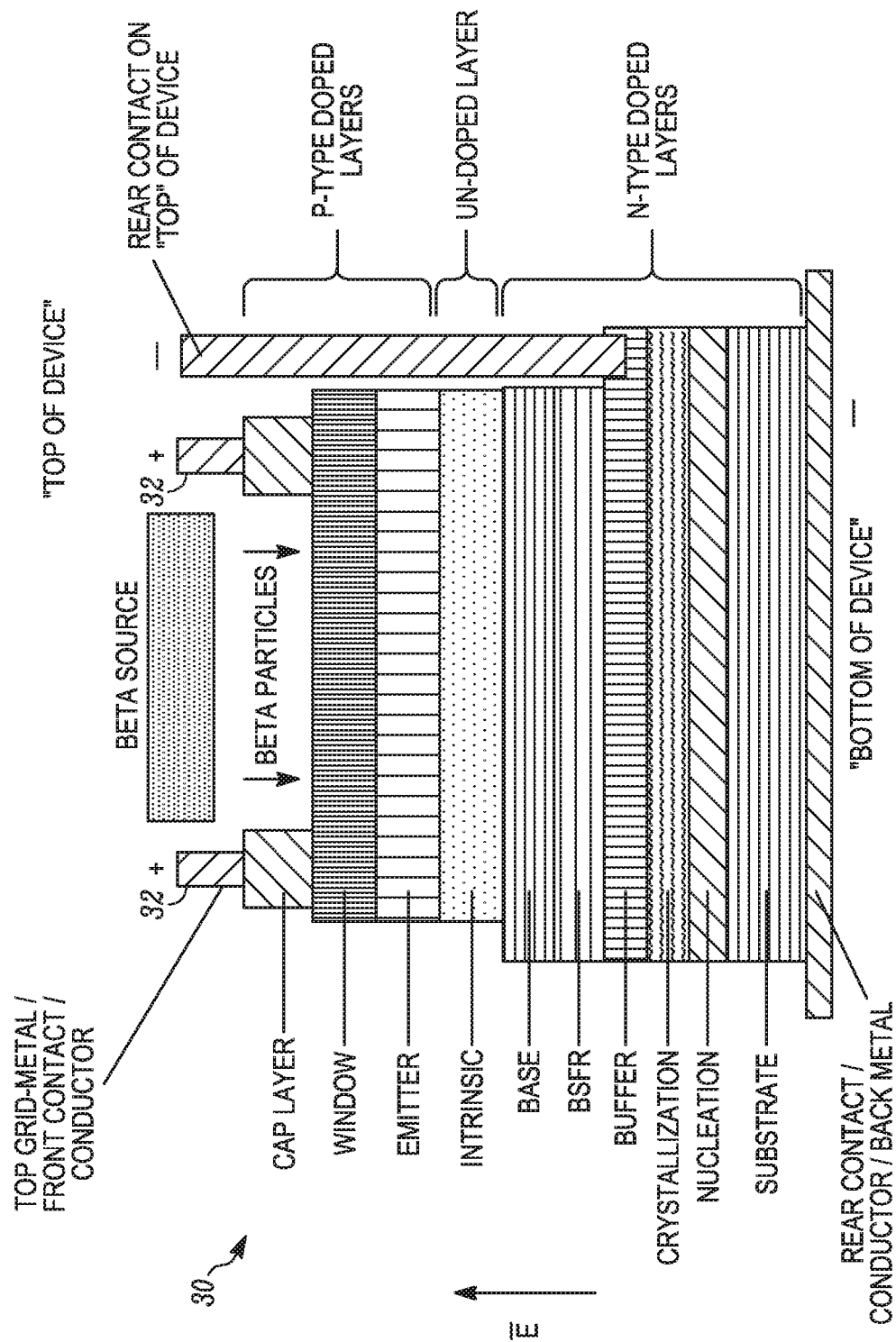
FIGS. 4 and 5 each depict a general configuration of different embodiments of betavoltaic device layers; in certain embodiments all depicted layers many not be present.

FIG. 4 generalizes some of the novel features of the invention. Each layer is lattice matched to the substrate so that the number of dislocations generated by growth of the individual layers is minimized. Generally, in a lattice-matched structure, one or more lattice parameters (e.g., the atomic distance between atoms) may not be exactly identical between structure layers, but generally are within a certain tolerance that is acceptable for favorable growth and desirable operation of the device.

In general, beta particles radiate outward randomly in all directions from the source. The beta particles in FIG. 4 are released from the tritiated metal hydride source in all direction; the arrowheads represent the direction of motion of those beta particles that strike the homojunction.

FIG. 4 illustrates individual layers of a generalized betavoltaic homojunction semiconductor 30 comprising, from the bottom:

a rear contact/conductor/back metal
a doped substrate (e.g., GaAs or Ge)
a nucleation layer (utilized with certain material layers to provide lattice matching)
a crystallization layer (also utilized with certain material layers to provide lattice matching)
a buffer layer (a preparatory layer for growth of the overlying layers)
a BSFR layer (a back-surface field reflector or minority carrier reflector/majority carrier transmitter layer; in the embodiment of FIG. 4 the n-type BSFR reflects minority carrier holes back toward the built-in field between the base and emitter)
a base layer (represents the "bottom" layer of the junction that creates the built-in field and the depletion region)
an intrinsic layer (prevents diffusion of dopants between the oppositely doped layers, but permits the built-in field to be established)
an emitter layer (represents the "top" layer of the junction that creates the built-in field and the depletion region)
a window layer (closely lattice-matched to the emitter layer below and the cap layer above, allowing majority carriers to pass to the cap layer and reflecting minority carriers back toward the emitter; in the illustrated embodiment the p-type window layer reflects minority carrier electrons)
a cap layer (highly doped in one embodiment)

If the dopant types are reversed from those set forth in FIG. 4, the structure is referred to as a n/p homojunction semiconductor.

FIG. 4 also indicates the electric field (the built-in field) as created across the depletion layer.

In the FIG. 4 embodiment the cap layer is present only below conductors 32, and not below the beta source.

Figure 5:
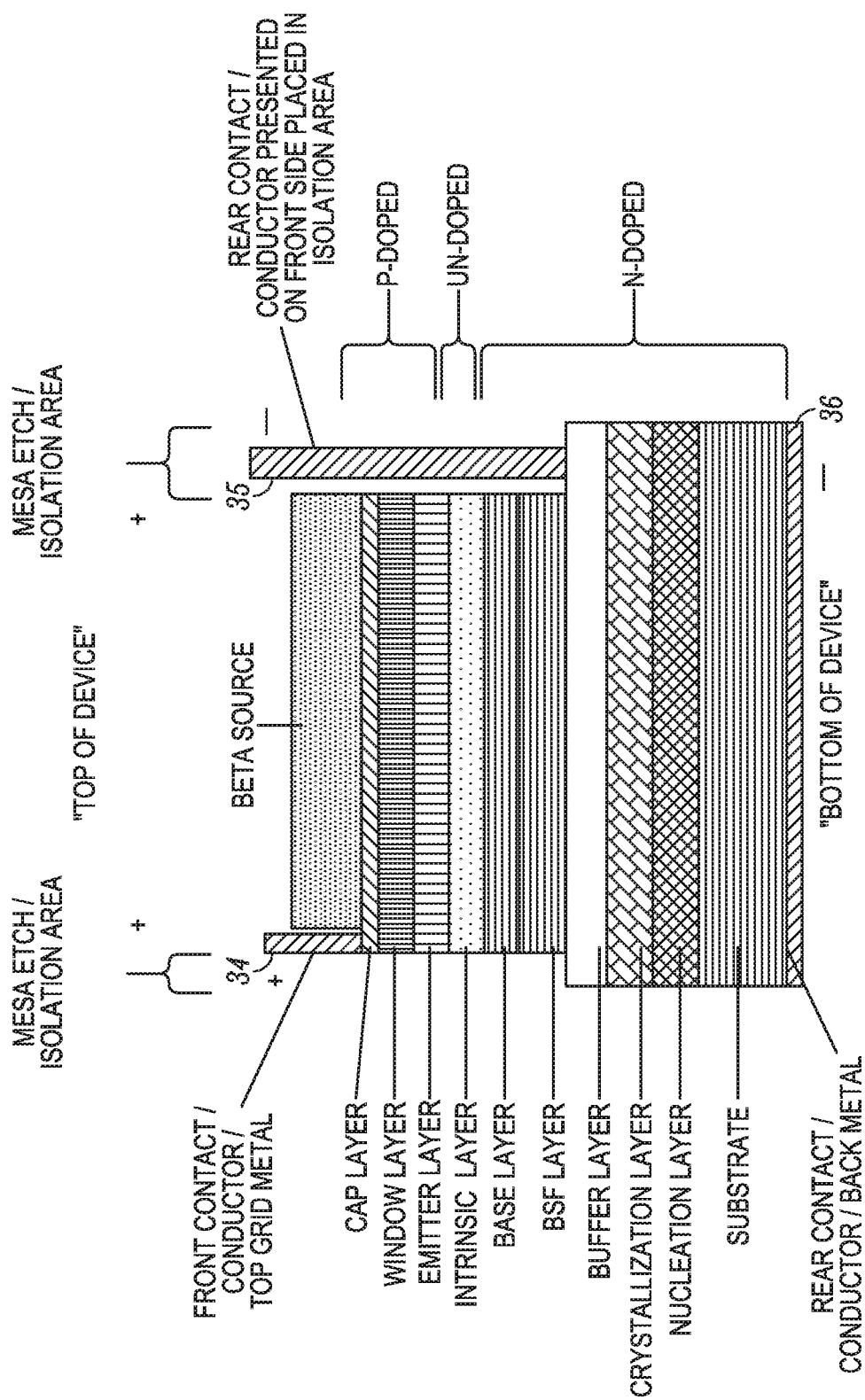

In the embodiment of FIG. 5 the cap layer is present below the beta source and connected to a conductor 34. A contact 35 is connected to the buffer layer as shown. Note that both contacts 34 and 35 are present on a same surface of the device, in FIG. 5 referred to as the "Top of Device." Presenting two contacts (with current generated between them) on the same surface of the device is advantageous when connecting such devices in a serial or parallel configuration. See the commonly-owned patent application entitled Series and/or Parallel Connected Alpha, Beta and Gamma Voltaic Cell Devices, filed on May 22, 2017, and assigned application Ser. No. 15/602,078. In certain embodiments comprising multiple connected betavoltaic devices, it may also be advantageous to have a rear contact/conductor/back contact 36.

There are several features of this FIG. 4 structure that allow efficient betavoltaic energy conversion. These features also apply to other embodiments of the invention as described herein, (e.g., FIGS. 2 and 5).

(a) High quality, large band gap semiconductor junction (e.g. InGaP, InAlGaP, InAlP) resulting in a highly efficient device;

(b) Back-surface field reflector that reflects minority carriers back onto the junction field. It may comprise a higher-band-gap lattice-matched layer, or a highly-doped layer of similar composition to the base, a pseudomorphic layer, or layers comprising other materials and techniques known in the art);

(c) A window layer that reflects minority carriers back to the emitter leading to a low dark current. This layer may comprise a higher-band-gap lattice-matched layer, or a highly-doped layer of similar composition to the emitter, a pseudomorphic layer, or layers comprising other materials and techniques known in the art);

(d) A cap layer covering the top surface and sufficiently thin to permit the transmission of beta particles into the betavoltaic homojunction structure;

(e) a 1000 to 3000 Angstrom intrinsic layer to act as a buffer to the diffusion of the base dopant (usually Zn) into the emitter region.

The features (a), (b) and (c) above may be important for solar cell operation, but their utilization in tritium betavoltaic application is considered novel in the present embodiment. The novel features (d) and (e) may be important for betavoltaic conversion, but they are not necessarily used for photovoltaic energy conversion.

It should be noted that the tritium betavoltaic structure presents novel and non-obvious features that provide a low dark current and a high voltage and collection efficiency. For example, the InAlP structure as described in Table 3 and Table 6 can yield up to an open circuit voltage between 1.0 and 1.2 Volts, a fill factor of 0.8 and an efficiency >11.5% based on the incident beta flux impinging on the semiconductor.

It should also be noted that several betavoltaic structure embodiments utilize tunnel junctions to serve as a means of changing the dominant carrier from electrons to holes, or vice versa. For example, tunnel junction concepts are employed in an embodiment with an n/p junction on a p-type substrate or in an embodiment with a p/n junction on an n-type substrate.

The tunnel junction is used to change the carriers and allow use a substrate doped the opposite type as the junction's base. Two different types of layers are utilized in the tunnel junction structures. These tunnel junctions involve a heavily doped n-layer adjacent to a heavily doped p-layer, referred to as $n^{++}$ and $p^{++}$ layers, respectively. Thicknesses are typically 100 Angstroms for both the $n^{++}$ and $p^{++}$ layers although they can range from approximately 50 Angstroms to 200 Angstroms, but can be made thinner or thicker in certain embodiments. The dopant levels are typically 5E18 to 1E19 cm-3 for Zinc in $p^{++}$ layers and similarly for Silicon doping in $n^{++}$ layers. However, other dopant types and concentrations known to those skilled in the art may be used.

Various betavoltaic structures based on GaAs and Ge substrates are summarized in Tables 1-6 below. It should be noted that Tables 1-6 are exemplary in nature and that other structures, layers, compositions, dopant types, dopant concentrations, and stoichiometries may be utilized. Other features of various materials and layers are set forth in the reference notes provided with the Tables.

TABLE 1

InGaP Cells on GaAs Substrates

| | p-GaAs Substrates | | n-GaAs Substrates | |
|---|---|---|---|---|
| | n/p InGaP | p/n InGaP | n/p InGaP | p/n InGaP |
| Layer 1 | pGaAs (substrate) | pGaAs (substrate) | nGaAs (substrate) | nGaAs (substrate) |
| Layer 2 | pGaAs (Est Crs Struc) | pGaAs (Est Crs Struc) | nGaAs (Est Crs Struc) | nGaAs (Est Crs Struc) |
| Layer 3 | pInAlP (reflector) | p++GaAs (p-layer TJ) | n++GaAs (p-layer TJ) | nInAlP (reflector) |
| Layer 4 | pInGaP (base) | n++GaAs (n-layer TJ) | p++GaAs (n-layer TJ) | pInGaP (base) |
| Layer 5 | InGaP (i-Layer) | nInAlP (reflector) | pInAlP (reflector) | InGaP (i-Layer) |
| Layer 6 | nInGaP (emitter) | pInGaP (base) | pInGaP (base) | pInGaP (emitter) |
| Layer 7 | nInAlP (window) | InGaP (i-layer) | InGaP (i-layer) | pInAlP (window) |

TABLE 1-continued

InGaP Cells on GaAs Substrates

| | p-GaAs Substrates | | n-GaAs Substrates | |
|---|---|---|---|---|
| | n/p InGaP | p/n InGaP | n/p InGaP | p/n InGaP |
| Layer 8 | n++GaAs (cap Layer) | pInGaP (emitter) | pInGaP (emitter) | p++GaAs (cap Layer) |
| Layer 9 | | pInAlP (window) | nInAlP (window) | |
| Layer 10 | | p++GaAs (cap layer) | n++GaAs (cap layer) | |

Notes:
1. Est Crs Struc designates a layer for establishing the crystal structure.
2. TJ designates a tunnel junction.
3. InGaP refers to a compound $In_xGa_{(1-x)}P$, (e.g. where x = 0.485 ± 0.01), or another appropriate stoichiometry that lattice matches GaAs known to those skilled in the art.
4. InAlP refers to a compound $In_xAl_{(1-x)}$, (e.g. where x = 0.48 ± 0.02), or another appropriate stoichiometry that lattice matches GaAs known to those skilled in the art.
5. P-type materials will typically be doped with Zn or other dopants known in the art with the dopant concentrations in the range of E16 cm−3 to E19 cm−3. It should be noted that the p, p+, and p++ designations represent successive higher dopant concentrations.
6. N-type materials are doped with Si or Te or other dopants known in the art with the doping density in the range of about E16 cm−3 to E19 cm−3. It should be noted that the n, n+, and n++ designations represent successively higher concentration ranges.
7. Reflector layer refers to layer at an interface between the base layer and the substrate that reflects minority carriers to minimize recombination losses.
8. Window layer refers to a layer adjacent the emitter that allows majority carriers pass to the cap layer and reflects minority carriers to minimize recombination losses.
9. The cap layer is generally heavily doped so that it is very conductive.
10. Cap layer dopant concentrations n++ and p++ may be changed to n or n+ and p or p+ respectively, in certain embodiments.

TABLE 2

In(AlGa)P Cells on GaAs Substrates

| | p-GaAs Substrates | | n-GaAs Substrates | |
|---|---|---|---|---|
| | n/p In(AlGa)P | p/n (AlGa)P | n/p (AlGa)P | p/n (AlGa)P |
| Layer 1 | pGaAs (substrate) | pGaAs (substrate) | nGaAs (substrate) | nGaAs (substrate) |
| Layer 2 | pGaAs (Est Crs Struc) | pGaAs (Est Crs Struc) | nGaAs (Est Crs Struc) | nGaAs (Est Crs Struc) |
| Layer 3 | pInAlP (reflector) | p++GaAs (p-layer TJ) | n++GaAs (p-layer TJ) | nInAlP (reflector) |
| Layer 4 | pIn(AlGa)P (base) | n++GaAs (n-layer TJ) | p++GaAs (n-layer TJ) | nIn(AlGa)P (base) |
| Layer 5 | In(AlGa)P (i-layer) | nInAlP (reflector) | pInAlP (reflector) | In(AlGa)P (i-layer) |
| Layer 6 | nIn(AlGa)P (emitter) | nIn(AlGa)P (base) | pIn(AlGa)P (base) | pIn(AlGa)P (emitter) |
| Layer 7 | nInAlP (window) | In(AlGa)P (i-layer) | In(AlGa)P (i-layer) | pInAlP (window) |
| Layer 8 | n++GaAs (cap layer) | pIn(AlGa)P (emitter) | nIn(AlGa)P (emitter) | p++GaAs (cap layer) |
| Layer 9 | | pInAlP (window) | nInAlP (window) | |
| Layer 10 | | p++GaAs (cap layer) | n++GaAs (cap layer) | |

Notes:
1. Est Crs Struc designates a layer to establish the crystal structure.
2. TJ designates a tunnel junction.
3. InAlP refers to a compound $In_xAl_{(1-x)}$, (e.g. where x = 0.48 ± 0.02), or any other appropriate stoichiometry that lattice matches GaAs known to those skilled in the art.
4. In(AlGa)P refers a compound $In_x(Al_yGa_{(1-y)})_{(1-x)}P$ (e.g. where x = 0.48 ± 0.01 and y= 0.2 ± 0.1), or any other appropriate stoichiometry that lattice matches GaAs known to those skilled in the art.
5. P-type materials will typically be doped with Zn or other dopants known in the art with the dopant concentrations in the range of about E16 cm−3 to E19 cm−3. It should be noted that the p, p+, and p++ designations represent successively higher dopant concentrations.
6. N-type materials are doped with Si or Te or other dopants known in the art with the doping being in the range of about E16 cm−3 to E19 cm−3. It should be noted that the n, n+, and n++ designations represent successive higher concentration ranges.
7. A reflector layer refers to layer at an interface between the base layer and substrate that reflects minority carriers so that recombination losses are minimized.
8. A window layer refers to a layer adjacent the emitter that allows majority carriers pass to the cap layer and reflects minority carriers to minimize recombination losses.
9. The cap layer is heavily doped so that it is very conductive.
10. Cap layer dopant concentrations n++ and p++ may be interchanged with n or n+ and p or p+, respectively.

TABLE 3

InAlP Cells on GaAs Substrates

| | p-GaAs Substrates | | n-GaAs Substrates | |
|---|---|---|---|---|
| | n/p InAlP | p/n InAlP | n/p InAlP | p/n InAlP |
| Layer 1 | pGaAs (substrate) | pGaAs (substrate) | nGaAs (substrate) | nGaAs (substrate) |
| Layer 2 | pGaAs (Est Crs Struc) | pGaAs (Est Crs Struc) | nGaAs (Est Crs Struc) | nGaAs (Est Crs Struc) |
| Layer 3 | p+ InAlP (reflector) | p++GaAs (p-layer TJ) | n++GaAs (p-layer TJ) | n+InAlP (reflector) |
| Layer 4 | pInAlP (base) | n++GaAs (n-layer TJ) | p++GaAs (n-layer TJ) | nInAlP (base) |
| Layer 5 | InAlP (i-layer) | n+InAlP (reflector) | p+InAlP (reflector) | InAlP (i-layer) |

TABLE 3-continued

InAlP Cells on GaAs Substrates

| | p-GaAs Substrates | | n-GaAs Substrates | |
|---|---|---|---|---|
| | n/p InAlP | p/n InAlP | n/p InAlP | p/n InAlP |
| Layer 6 | nInAlP (emitter) | nInAlP (base) | pInAlP (base) | pInAlP (emitter) |
| Layer 7 | n+InAlP (window) | InAlP (i-layer) | InAlP (i-layer) | p+InAlP (window) |
| Layer 8 | n+GaAs (cap Layer) | pInAlP (emitter) | nInAlP (emitter) | p+GaAs (cap Layer) |
| Layer 9 | | p+InAlP (window) | n+InAlP (window) | |
| Layer 10 | | p++GaAs (cap layer) | n++GaAs (cap layer) | |

Notes:
1. Est Crs Struc designates a layer that establishes a crystal structure.
2. TJ designates a tunnel junction.
3. InAlP refers to a compound $In_xAl_{(1-x)}$, (e.g. where x = 0.48 ± 0.02), or any other appropriate stoichiometry that lattice matches GaAs known to those skilled in the art.
4. P-type materials are typically doped with Zn or other dopants known in the art, with the dopant concentrations being in the approximate range of E16 cm−3 to E19 cm−3. It should be noted that the p, p+, and P++ designations represent successively higher dopant concentrations.
5. N-type materials are doped with Si or Te or other dopants known in the art, with the doping concentration in the range of about E16 cm−3 to E19 cm−3. It should be noted that the n, n+, and n++ designations represent successively higher concentration ranges.
6. A reflector refers to layer at an interface between the base layer and substrate that reflects minority carriers so that recombination losses are minimized.
7. A window refers to a layer adjacent the emitter that allows majority carriers to pass to the cap layer and reflects minority carriers to minimize recombination losses.
8. The cap layer is heavily doped so that it is very conductive.
9. Cap layer n-type and p-type dopant concentrations may be respectively selected as n, n+, n++ and p, p+, p++.

In other embodiments the GaAs substrate of Tables 1-3 is replaced by a germanium substrate. The overlying semiconductor layers may comprise Ge or GaAs. Generally, when used in the present written description, a first material layer overlying a second material layer refers to the first material layer above the second material layer when configured in a vertical orientation. The first and second material layers may be in physical contact or the first material layer may be proximate the second material layer, but not necessarily in contact with the second material layer.

Growth of high quality GaAs layers on germanium requires growth of a nucleation layer on the germanium to create a virtual GaAs substrate. One approach grows a first GaAs layer at a relatively low temperature of about 550 degrees C. followed by growth of second GaAs layer at a temperature more commonly used for GaAs materials, namely about 700 degrees C. Growth of the low temperature GaAs layer leads to a relatively smooth GaAs layer, which improves subsequent growth of the high temperature GaAs layer.

In one embodiment a deliberate impurity (e.g. Indium) may be introduced during the nucleation growth process, which has the effect of replacing atoms in the crystal structure to change certain lattice parameters. This technique is implemented to permit the matching of lattice parameters for chemical systems that would normally have very different lattice constants, even when they have the same crystal structure To reduce the generation of anti-phase boundaries, which can lead to recombination centers, off-oriented Ge materials (such as Ge(001)) may be used for growth of the low temperature GaAs layer. Although modifications of this approach have been developed, growth of GaAs nucleation layers, or other nucleation layers intended for use with the structures outlined in other embodiments, resulting in high quality GaAs films on Ge substrates usually involve these two features: use of off-oriented Ge(001) substrates and the low temperature film of GaAs.

In general, layers in betavoltaic structures based on Ge substrates parallel those grown on GaAs substrates. Both n- and p-type Ge substrates are used and both must first have nucleation layers grown to achieve the growth of high-quality GaAs films.

However, one unique feature must be dealt with when growing semiconductor layers on p-Ge substrates. Growth of As-containing and P-containing films on a p-Ge substrate results in the formation of an n-type layer on the surface of the Ge substrate. To counter the formation of this artifact layer, the first layer grown on the p-type Ge substrate is heavily doped p-GaAs. This GaAs layer thus serves two purposes, it establishes a GaAs crystalline structure and the large Zn doping level (about 1E18 to about 5E18) mitigates the potential problem presented by the possible formation of an n-type artifact layer on the p-type Ge substrate, in both cases of n- and p-type Ge substrates.

Generally, the references to a nucleation layer or a nucleation process herein refer to the growth of layers identified as a nucleation layer and a crystallization layer. A buffer layer may also be formed above these two layers. See, for example, FIG. 4.

Structures based on InGaP, In(AlGa)P and InAlP grown on Ge substrates are exemplified by, but not limited to, Tables 4, 5 and 6.

TABLE 4

InGaP Cells on Ge Substrates

| | | p-Ge Substrates | | n-Ge Substrates | |
|---|---|---|---|---|---|
| | | n/p InGaP | p/n InGaP | n/p InGaP | p/n InGaP |
| Layer 1 | | pGe (substrate) | pGe (substrate) | nGe (substrate) | nGe (substrate) |
| Layer 2 | | p+GaAs (Nucl Layer) | p+GaAs (Nucl Layer) | nGaAs (Nucl Layer) | nGaAs (Nucl Layer) |
| Layer 3 | | p+GaAs (Est Crs Struc) | p+GaAs (Est Crs Struc) | nGaAs (Est Crs Struc) | nGaAs (Est Crs Struc) |
| Layer 4 | | pInAlP (reflector) | p++GaAs (p-layer TJ) | n++GaAs (n-layer TJ) | nInAlP (reflector) |

TABLE 4-continued

InGaP Cells on Ge Substrates

|  | p-Ge Substrates | | n-Ge Substrates | |
| --- | --- | --- | --- | --- |
|  | n/p InGaP | p/n InGaP | n/p InGaP | p/n InGaP |
| Layer 5 | pInGaP (base) | n++GaAs (n-layer TJ) | p++GaAs (p-layer TJ) | nInGaP (base) |
| Layer 6 | InGaP (i-layer) | nInAlP (reflector) | pInAlP (reflector) | InGaP (i-layer) |
| Layer 7 | nInGaP (emitter) | nInGaP (base) | pInGaP (base) | pInGaP (emitter) |
| Layer 8 | nInAlP (window) | InGaP (i-layer) | InGaP (i-layer) | pInAlP (window) |
| Layer 9 | n+GaAs (cap Layer) | pInGaP (emitter) | nInGaP (emitter) | p+GaAs (cap Layer) |
| dLayer 10 |  | pInAlP (window) | nInAlP (window) |  |
| Layer 11 |  | p+GaAs (cap layer) | n+GaAs (cap layer) |  |

Notes:
1. Est Crs Struc designates a layer for establishing the crystal structure.
2. Nucl Layer designates the nucleation layer as discussed elsewhere herein.
3. Layer 3 for the structures grown on p-Ge substrates is doped with Zn to a level of about 1E18 cm−3 to prevent formation of an artifact n-layer. The layer also establishes the GaAs crystal structure. For the p-substrate and the n/p InGaP embodiment it may not be necessary to dope layer 3 (see the Table above) to a p+ level, as a lower doping may be sufficient to establish the crystal structure without causing formation of an artifact layer at the interface between the two, and subsequently needing to suppress the creation of this artifact layer. As descried elsewhere herein, the artifact layer can be caused by mixing of the Ge and InGaP at the boundary.
4. TJ designates a tunnel junction
5. InGaP refers to a compound $In_xGa_{(1-x)}P$, (e.g. where x = 0.485 ± 0.01), or any other appropriate stoichiometry that lattice matches GaAs, as known to those skilled in the art.
6. InAlP refers to a compound $In_xAl_{(1-x)}$, (e.g. where x = 0.48 ± 0.02), or any other appropriate stoichiometry that lattice matches GaAs known to those skilled in the art.
7. P-type materials will typically be doped with Zn or other dopants known in the art with the dopant concentrations being in the range of E16 cm−3 to E19 cm−3. It should be noted that the p, p+, and P++ designations represent successively higher dopant concentrations.
8. N-type materials are doped with Si or Te or other dopants known in the art with the doping being in the range of about E16 cm−3 to E19 cm−3. It should be noted that the n, n+, and n++ designations represent successively higher concentration ranges.
9. A reflector layer refers to layer at an interface between the base layer and substrate that reflects minority carriers so that recombination losses are minimized.
10. A window layer refers to a layer adjacent to the emitter that allows majority carriers to
pass to the cap layer and reflects minority carriers to minimize recombinations.
11. The cap layer is heavily doped so that it is very conductive as n+ for the n-type window or p+ for the p-type window.
12. The cap layer may also be n or n++ or p or p++

30

TABLE 5

In(AlGa)P Cells on Ge Substrates

|  | p-Ge Substrates | | n-Ge Substrates | |
| --- | --- | --- | --- | --- |
|  | n/p In(AlGa)P | p/n In(AlGa)P | n/p In(AlGa)P | p/n In(AlGa)P |
| Layer 1 | pGe (substrate) | pGe (substrate) | nGe (substrate) | nGe (substrate) |
| Layer 2 | p+GaAs (Nucl Layer) | p+GaAs (Nucl Layer) | nGaAs (Nucl Layer) | nGaAs (Nucl Layer) |
| Layer 3 | pGaAs (Est Crs Struc) | pGaAs (Est Crs Struc) | nGaAs (Est Crs Struc) | nGaAs Est Crs Struc) |
| Layer 4 | pInAlP (reflector) | p++GaAs (p-layer TJ) | n++GaAs (n-layer TJ) | nInAlP (reflector) |
| Layer 5 | pIn(AlGa)P (base) | n++GaAs (n-layer TJ) | p++GaAs (p-layer TJ) | nIn(AlGa)P (base) |
| Layer 6 | In(AlGa)P (i-layer) | nInAlP (reflector) | pInAlP (reflector) | In(AlGa)P (i-Layer) |
| Layer 7 | nIn(AlGa)P (emitter) | nIn(AlGa)P (base) | pIn(AlGa)P (base) | pIn(AlGa)P (emitter) |
| Layer 8 | nInAlP (window) | In(AlGa)P (i-layer) | In(AlGa)P (i-layer) | pInAlP (window) |
| Layer 9 | n+GaAs (cap Layer) | pIn(AlGa)P (emitter) | nIn(AlGa)P (emitter) | p+GaAs (cap Layer) |
| Layer 10 |  | pInAlP (window) | nInAlP (window) |  |
| Layer 11 |  | p+GaAs (cap layer) | n+GaAs (cap layer) |  |

Notes:
1. Est Crs Struc designates a layer to establish the crystal structure
2. Nucl Layer designates a nucleation layer as discussed elsewhere herein.
3. Layer 3 for the structures grown on p-Ge substrates is doped with Zn to a level of about 1E18 cm−3 to prevent formation of the artifact n-layer. The layer also establishes GaAs structure.
4. TJ designates a tunnel junction
5. InAlP refers to a compound $In_xAl_{(1-x)}$, (e.g. where x = 0.48 ± 0.02), or any other appropriate stoichiometry that lattice matches GaAs known to those skilled in the art.
6. In(AlGa)P refers to a compound $In_x(Al_yGa_{(1-y)})_{(1-x)}P$ (e.g. where x = 0.48 ± 0.01 and y = 0.2 ± 0.1), or any other appropriate stoichiometry that lattice matches GaAs known to those skilled in the art.
7. P-type materials will typically be doped with Zn or other dopants known in the art with the dopant concentrations being in the range of E16 cm−3 to E19 cm−3. It should be noted that the p, p+, and P++ designations represent successively higher dopant concentrations.
8. N-type materials are doped with Si or Te or other dopants known in the art with the doping being in the range of about E16 cm−3 to E19 cm−3. It should be noted that the n, n+, and n++ designations represent successively higher concentration ranges.
9. A reflector layer refers to layer at an interface between the base layer and a substrate that reflects minority carriers so that recombination losses are minimized.
10. A window layer refers to a layer adjacent the emitter that allows majority carriers pass to the cap layer and reflects minority carriers to minimize recombination losses.
11. The cap layer is heavily doped so that it is very conductive as n+ for the n-type window or p+ for the p-type window.
12. The cap layer may also be n or n++ or p or p++

TABLE 6

InAlP Cells on Ge Substrates

| | p-Ge Substrates | | n-Ge Substrates | |
| --- | --- | --- | --- | --- |
| | n/p InAlP | p/n InAlP | n/p InAlP | p/n InAlP |
| Layer 1 | pGe (substrate) | pGe (substrate) | nGe (substrate) | nGe (substrate) |
| Layer 2 | p+GaAs (Nucl Layer) | p+GaAs (Nucl Layer) | nGaAs (Nucl Layer) | nGaAs (Nucl Layer) |
| Layer 3 | p+GaAs (Est Crs Struc) | p+GaAs (Est Crs Struc) | nGaAs (Est Crs Struc) | nGaAs (Est Crs Struc) |
| Layer 4 | p+InAlP (reflector) | p++GaAs (p-layer TJ) | n++GaAs (p-layer TJ) | n+ InAlP (reflector) |
| Layer 5 | pInAlP (base) | n++GaAs (n-layer TJ) | p++GaAs (n-layer TJ) | nInAlP (base) |
| Layer 6 | InAlP (i-layer) | n+InAlP (reflector) | p+InAlP (reflector) | InAlP (i-layer) |
| Layer 7 | nInAlP (emitter) | nInAlP (base) | pInAlP (base) | pInAlP (emitter) |
| Layer 8 | n+InAlP (window) | InAlP (i-layer) | InAlP (i-layer) | p+InAlP (window) |
| Layer 9 | n+GaAs (cap Layer) | pInAlP (emitter) | nInAlP (emitter) | p+GaAs (cap Layer) |
| Layer 10 | | p+InAlP (window) | n+InAlP (window) | |
| Layer 11 | | p+GaAs (cap layer) | n+GaAs (cap layer) | |

Notes:
1. Est Crs Struc designates to a layer to establish crystal structure
2. Nucl Layer designates a nucleation layer as discussed elsewhere herein.
3. Layer 3 for the structures grown on p-Ge substrates is doped with Zn to a level of about 1E18 cm−3 to prevent formation of an artifact n-layer. The layer also establishes GaAs structure.
4. TJ designates a tunnel junction
5. InAlP refers to a compound $In_xAl_{(1-x)}$, (e.g. where x = 0.48 ± 0.02), or any other appropriate stoichiometry that lattice matches GaAs known to those skilled in the art.
6. P-type materials will typically be doped with Zn or other dopants known in the art with the dopant concentrations being in the range of E16 cm−3 to E19 cm−3. It should be noted that the p, p+, and P++ designations represent successive higher dopant concentrations.
7. N-type materials are doped with Si or Te or other dopants known in the art with the doping being in the range of about E16 cm−3 to E19 cm−3. It should be noted that the n, n+, and n++ designations represent successive higher concentration ranges.
8. Reflector refers to layer at an interface between the base layer and the substrate that reflects minority carriers so that recombination losses are minimized.
9. A window refers to a layer adjacent the emitter that allows majority carriers pass to the cap layer and reflects minority carriers to minimize recombination losses.
10. The cap layer is heavily doped so that it is very conductive as n+ for the n-type window or p+ for the p-type window.
12. The cap layer may also be n or n++ or p or p++.

It should be noted that in one embodiment a betavoltaic cell may be grown on each side of the semiconductor substrate. For instance, for either a GaAs or a Ge substrate, a combination of a p/n and n/p betavoltaic structure (e.g. InGaP, InAlP, InAlGaP, or others) may be grown on opposing sides of a common substrate to create a bilateral betavoltaic structure (i.e., a double-sided betavoltaic structure) yielding twice the open circuit voltage of a single-sided counterpart. Just as in the case of a single-sided betavoltaic, each side of the bilateral cell requires a source of beta flux impinging on the respective junctions. The use of tunnel junctions may be required to allow the current to flow in a series arrangement between the two betavoltaic cells.

In one embodiment of the present invention, the tritium source is a tritium metal hydride (sometimes referred to as a metal tritide), in contact with the top surface of the betavoltaic structure as shown in FIG. 1 or more generally as a beta source in FIG. 4. The metal tritide may be formed by depositing one or a combination of hydride forming metals (e.g. scandium, titanium, magnesium, palladium, lithium etc.). A thickness of the metal tritide layer is typically less than one micron, but can be thicker. The metal tritide layer may be as thin as 50-100 nanometers, but in certain embodiments may be thinner.

The metal layer may be placed on top of the betavoltaic cell by directly depositing on top of the betavoltaic cell's active area (e.g. window or cap layer) through methods known in the art (e.g. evaporation, electro deposition etc.).

The tritium metal hydride may comprise a combination of metals, metal layers, or alloys capable of absorbing or retaining tritium in its metal matrix. Alternatively, the metal tritide layer may be deposited on a separate thin substrate (e.g. ~25 microns or less to ~500 microns or up to millimeter thickness range) that is mechanically connected to the betavoltaic cell's active area via a pressure joint, or by using epoxy spot welding.

The metal tritide is typically formed by exposure to tritium gas at pressures ranging 0.25 to 20 Bar and temperatures ranging approximately 100° C. to 600° C. for durations ranging minutes to days. It should be noted that metal tritides can also be formed with temperatures and pressures outside of the above-mentioned range and can also be formed through chemical and electrochemical reactions as is known in the art.

A layer of palladium ranging from approximately 1 nanometer to 500 nanometers may be deposited over (i.e. capping-off) a scandium, titanium, magnesium or lithium metal or other tritide forming metal, combination of metals, metal layers or alloys in order to reduce the tritium loading temperature and stabilize the tritium within the metal matrix after the tritide has been formed. The metal tritide layer may also be formed by an in-situ evaporation of the metal in the presence of tritium.

Bi-directional metal tritide sources (i.e. with betas emanating from opposing surfaces) may be utilized in one embodiment of this invention. For example, the metal tritide may be formed as a film on top of the betavoltaic cell's active semiconductor area such that a first surface of the metal tritide is in contact with or proximate to the semiconductor area. Then a second cell can be placed in direct contact with (or proximate to) a second surface of the metal tritide. See in particular FIGS. 7B (and its associated FIG. 7A) and 8B (and its associated FIG. 8A).

Figure 15:
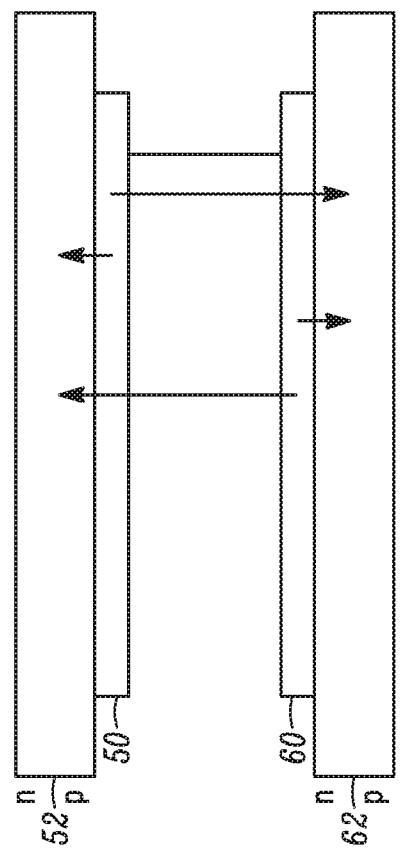
FIG. 15 illustrates another embodiment comprising two beta sources and two semiconductor material layers.

In an embodiment of FIG. 15, a betavoltaic junction device comprises, a beta source 50, a stack of n and p semiconductor layers 52, a beta source 60, and a stack of n and p semiconductor layers 62 oriented as shown. Beta particles or radioisotopes (e.g., alpha particles, beta particles, or gamma rays) generated by the beta source 50 pass into the semiconductor layers 52 and 62, and beta particles and radioisotopes emanating from the beta source 60, and are also absorbed in the semiconductor layers 52 and 62.

In another embodiment of the present invention the conductive contact lines on the top surface of the betavoltaic homojunction can be very thin and extend along the perimeter of the semiconductor. Such a contact ring collects the current from the semiconductor while providing a minimal shadowing effect to the radioactive source's beta flux that impinges on the surface of the semiconductor. The contact ring for the betavoltaic semiconductor may be formed in the same manner as solar cell industry uses to make contact gridlines on the solar cell semiconductor. However, the betavoltaic cell contact ring is substantially different from a solar cell where a series of gridlines uniformly cover the surface of the semiconductor and can cover approximately 5-10% of the semiconductor surface. This uniform coverage creates a shadowing effect resulting in a proportional loss of power from the solar cell. In contrast, the betavoltaic cell's contact ring may be reduced to a small perimeter (e.g. outlining a 1 cm×1 cm cell or 3 cm×3 cm cell etc.) or it may comprise only a contact point or set of contact points or lines. This configuration may be utilized due to the low magnitude of current collected from the betavoltaic device (in the nanoamp to microamp per square centimeter range), as opposed to solar cells where the range is generally in the milliamp per square centimeter range. Thus, whereas solar cells require relatively low series resistance (less than one ohm per square centimeter of cell area) by the inclusion of more contact line coverage, betavoltaic cells can function efficiently with much greater values of series resistance due to the small current values generated by betavoltaic devices.

The conductive contacts on the rear surface (also referred to as the bottom or back surface) of the betavoltaic homojunction device (see FIG. 4 or 5, for example) can be formed by many techniques known to those skilled in the art. When a conductive substrate is utilized, and a junction is grown on only one side of the conductive substrate, e.g., the front side, the rear contact may be established with blanket deposition of conductive contact materials onto the bottom surface of the substrate. Rear or bottom contacts may also be engineered on the bottom side of the substrate to meet specific requirements and may be in the form of metal contacts/gridlines/ring/terminals/pads/points/epoxy(s)/solders, etc. Similar to the betavoltaic cell's top contacts, the rear or bottom contact may be formed as a ring and may be reduced to a small perimeter (e.g. outlining a 1 cm×1 cm cell or 3 cm×3 cm cell etc. may comprise only contact points or lines.

In an embodiment utilizing a non-conductive or insulating substrate, the rear contact can be established at any point where access can be gained to a material doped to the type opposite to that of the material layer proximate to the front contact. Specifically, in one embodiment the front contact is established to the cap layer such that the rear contact may be established with one of the opposite polarity layers (e.g., buffer, BSF, base, etc.).

FIG. 4 illustrates a case in which a rear contact is presented on a top (or front) surface of the device by contacting the n-type buffer layer. In this illustration, a front contact is established on the top surface to the p-type doped cap layer. As can be seen in FIG. 4, a portion of the top layers may be chemically etched, physically ablated, or otherwise removed to expose the two oppositely-doped layers for receiving the respective contacts.

Conversely, a portion of the substrate may be chemically etched, physically ablated, or otherwise removed partially from the bottom to reach these layers. In this case contacts to both the n-type and p-type layers are presented on the bottom/rear/back surface of the device.

In any case, the exposed region(s) of the semiconductor layers may accommodate contacts in the form of metal contacts/gridlines/ring/terminals/pads/points/epoxy(s)/solders, etc.

It should be noted that any of the approaches described herein may also be utilized for conductive substrates.

In any of the embodiments presented herein, device terminals may be introduced on any surface of the junction device (e.g., homo junctions or hetero junctions) provided that the layer is physically accessible or can be accessed through removal of proximal materials by chemical etching, physical ablation, or otherwise removed by methods known to those skilled in the art.

In yet another embodiment of this invention, a thin cap layer (e.g. GaAs) is grown to a desired thickness (e.g. 50-500 Angstroms or less) and uniformly covers the betavoltaic window layer. In this configuration, the contact metal gridlines for current collection are replaced with a tritium metal tritide deposited uniformly over the cap layer. In this configuration, the tritium metal tritide serves as both a metal contact collector and a beta-source emitter resulting in less shadowing of betas impinging on the betavoltaic cell and a simpler construction of the betavoltaic cell. As previously described the GaAs cap layer may be replaced by other suitable group III-V materials or compounds.

The contacts in a betavoltaic semiconductor can result in a shadow coverage that is much less than about 1%, thereby providing a higher efficiency for the betavoltaic cell (i.e., battery). Specific shadow coverage and thicknesses of contact ring, lines or dots required by a betavoltaic semiconductor is dictated by consideration of sheet conductance of the top surface cell layers, namely, the cap, window and emitter layers. The sheet resistance for a tritium betavoltaic cell can be relatively large (e.g. >100 Ohms per square centimeter).

In all embodiments of the present invention it may be desirable to shield the edges of the betavoltaic structure from beta particles. This constitutes another novel aspect of the present invention. As is known in the art, if the energy of a beta particle is large enough, the particle can cause the displacement of an atom in a crystalline semiconductor. Atomic vacancies can act as a recombination center for EHPs in semiconductors and can degrade betavoltaic efficiencies. Fortunately, the threshold for atomic displacement in semiconductors is typically greater than 250 keV. Therefore, tritium beta particles, as well as beta particles from Promethium-147 and Nickel 63, do not degrade semiconductor diode properties as a result of beta absorption within the bulk of the material. However, low energy betas can create dangling bonds along the junction periphery, which can cause shunting currents or carrier recombination at the junction edges. If the edges are not properly shielded or protected from the beta flux, the betavoltaic device performance/efficiency may be degraded.

As illustrated in FIGS. 7A, 7B, 8A, and 8B, the junction edges may be protected by retaining the tritium source within the perimeter contact metal gridlines at a distance such that the beta particle cannot reach the edges of the semiconductor. As described previously, the tritide source may be deposited on the cell's window or cap layer through any of the methods known to those skilled in the art or may be present on a separate substrate or an adjacent betavoltaic cell. Furthermore, the metal perimeter contact gridlines act as a physical barrier to the beta flux, thus preventing the beta particles from striking the edge of the device. It should be understood that protection of the edges may be accomplished through a variety of means such as various forms of physical barriers (e.g. deposited metal barriers, polymers, insulators, etc.). According to another technique, ensuring a relatively large physical distance from the beta particle source to the device edges may also suffice.

In all embodiments of the present invention, the voltage and current may be scaled up via the stacking of betavoltaic semiconductors and tritium sources (betavoltaic cells). Betavoltaic cell layers may be stacked vertically or arranged horizontally and configured electrically in series or parallel. See for example, the commonly-owned patent application entitled Series and/or Parallel Connected Alpha, Beta and Gamma Voltaic Cell Devices, filed on May 22, 2017, and assigned application Ser. No. 15/602,078, which is incorporated herein in its entirety. Electrical connection can be established by utilizing through-vias as power lead contacts across betavoltaic cell layers, by using current-channeling interposers (e.g. flexible circuit cards) in between betavoltaic cells or groups of cells, or by many other methods common in the art. Various stacking and interconnection configurations can be used to produce varying voltage and current outputs from the betavoltaic battery. See for example, the various approaches for connecting betavoltaic cells in series and parallel configurations in FIGS. 6-9 and the commonly-owned application Ser. No. 15/602,078 referred to above.

Figure 6:
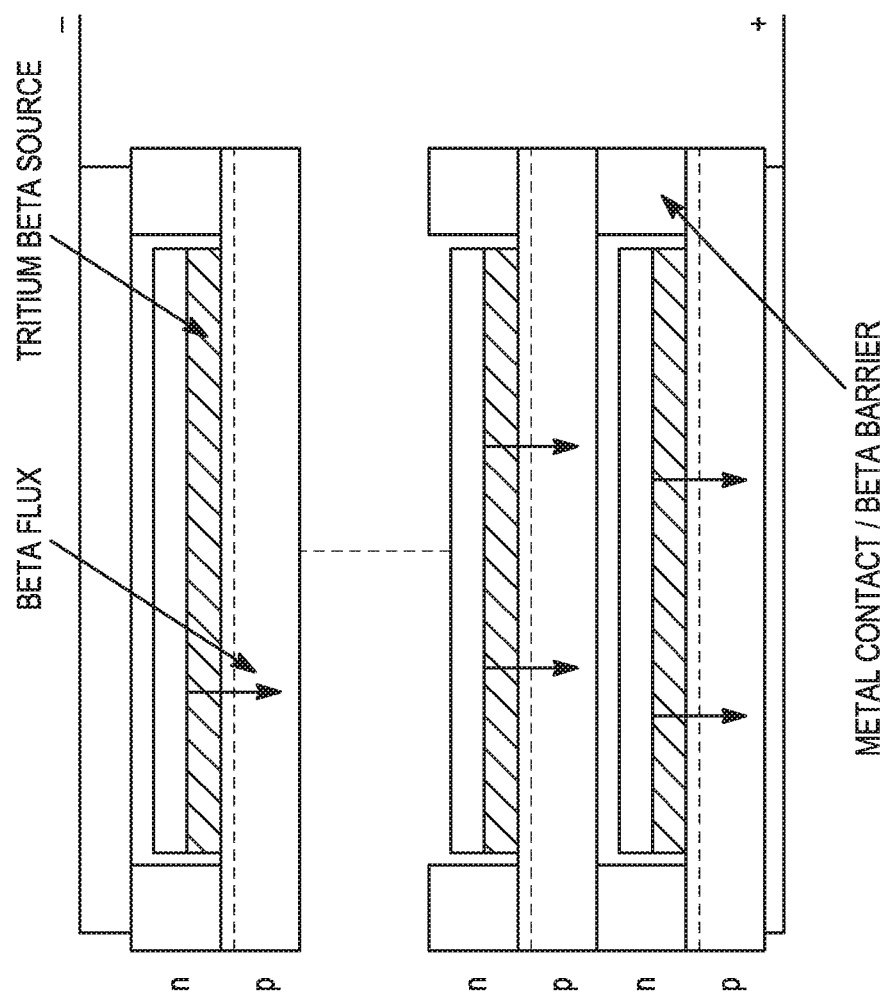
FIG. 6 illustrates one embodiment for stacking a plurality of n/p (or p/n) cells in series using uni-directional beta sources.

Arranging multiple (N) layers of n/p cells in series with unidirectional beta sources is illustrated in FIG. 6. If it is assumed that all cells have identical properties, namely, the same values for short circuit current ($I_{sc}$), open circuit voltage ($V_{oc}$) and maximum power ($P_{max}$), and assuming the contacts between devices are ideal, the characteristics for the series stack of N cells are:

$(I_{sc})_{stack}=I_{sc}$, $(V_{oc})_{stack}=N \times V_{oc}$, and $(P_{max})_{stack}=N \times P_{max}$ Electrical connection between cells can be established by a soft metal such as indium or by a deposited peripheral strip of gold or another appropriate metal. Electrical contact can be made by contact pressure between metals, solders, electrically conductive epoxies, and other methods well known in the art. FIG. 6 depicts an approach where the electrical connections are made on the periphery of cells. Similar electrical connections can be made for either n/p or p/n semiconductor layers within the betavoltaic battery.

Figure 7A:
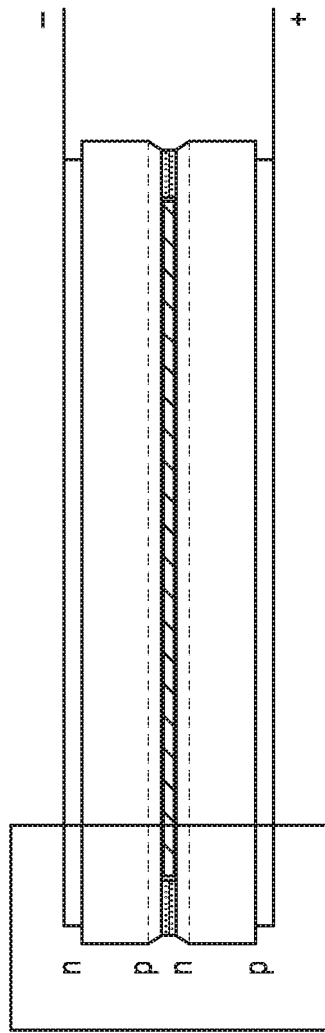
FIGS. 7A and 7B illustrate a series connection of a p/n and an n/p cell.
Figure 7B:
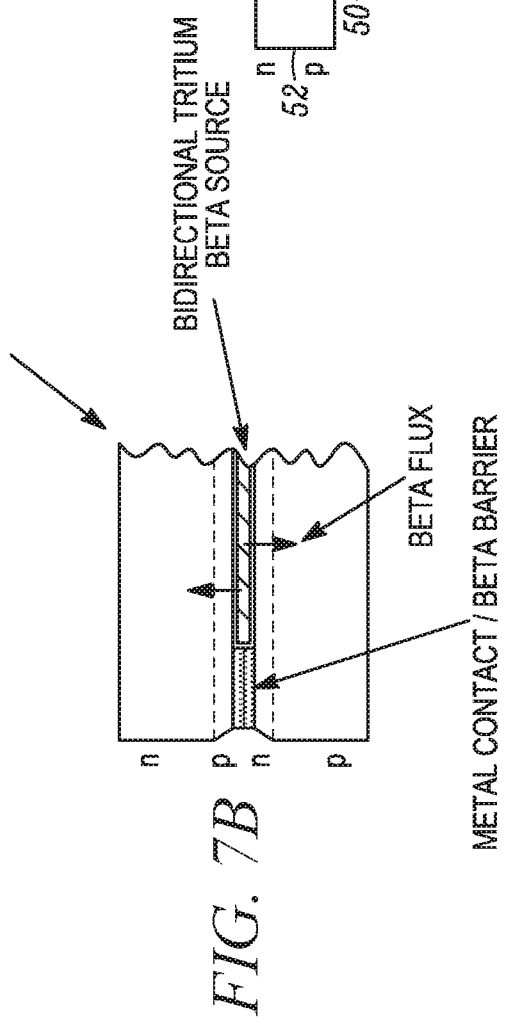
Figure 8A:
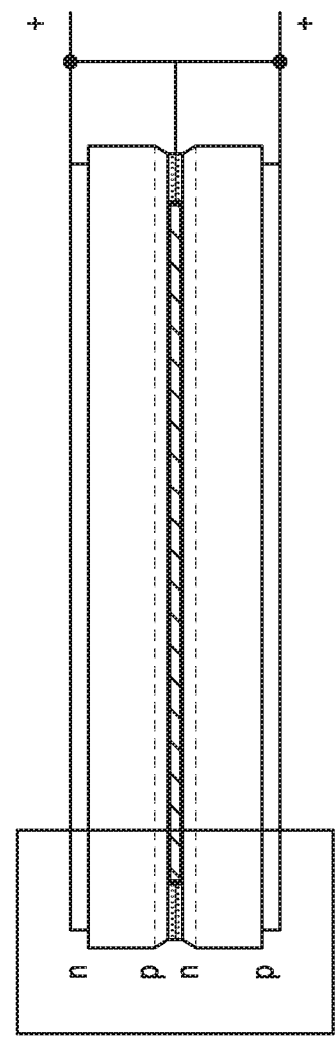
FIGS. 8A and 8B illustrate an embodiment for stacking a plurality of n/p (or p/n) cells in parallel with bi-directional beta sources.
Figure 8B:
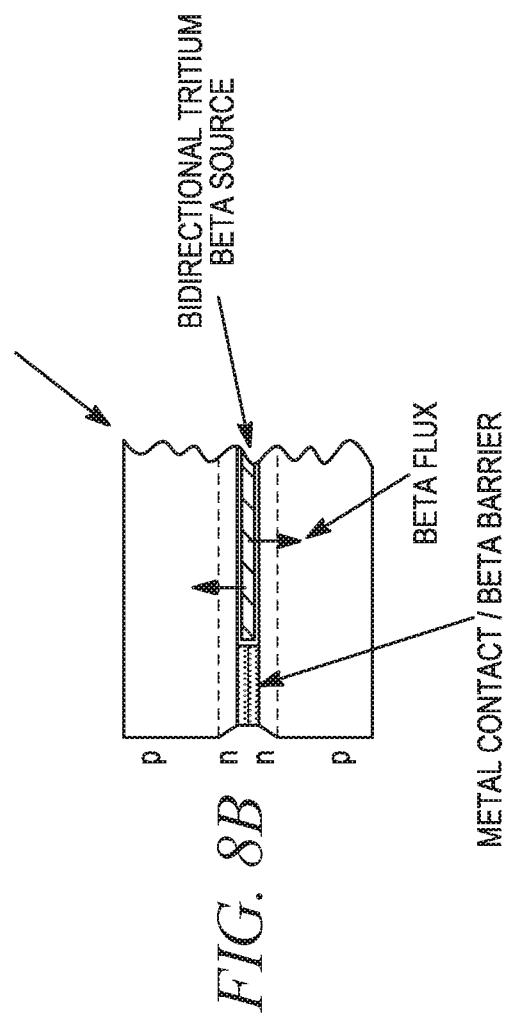
Figure 9:
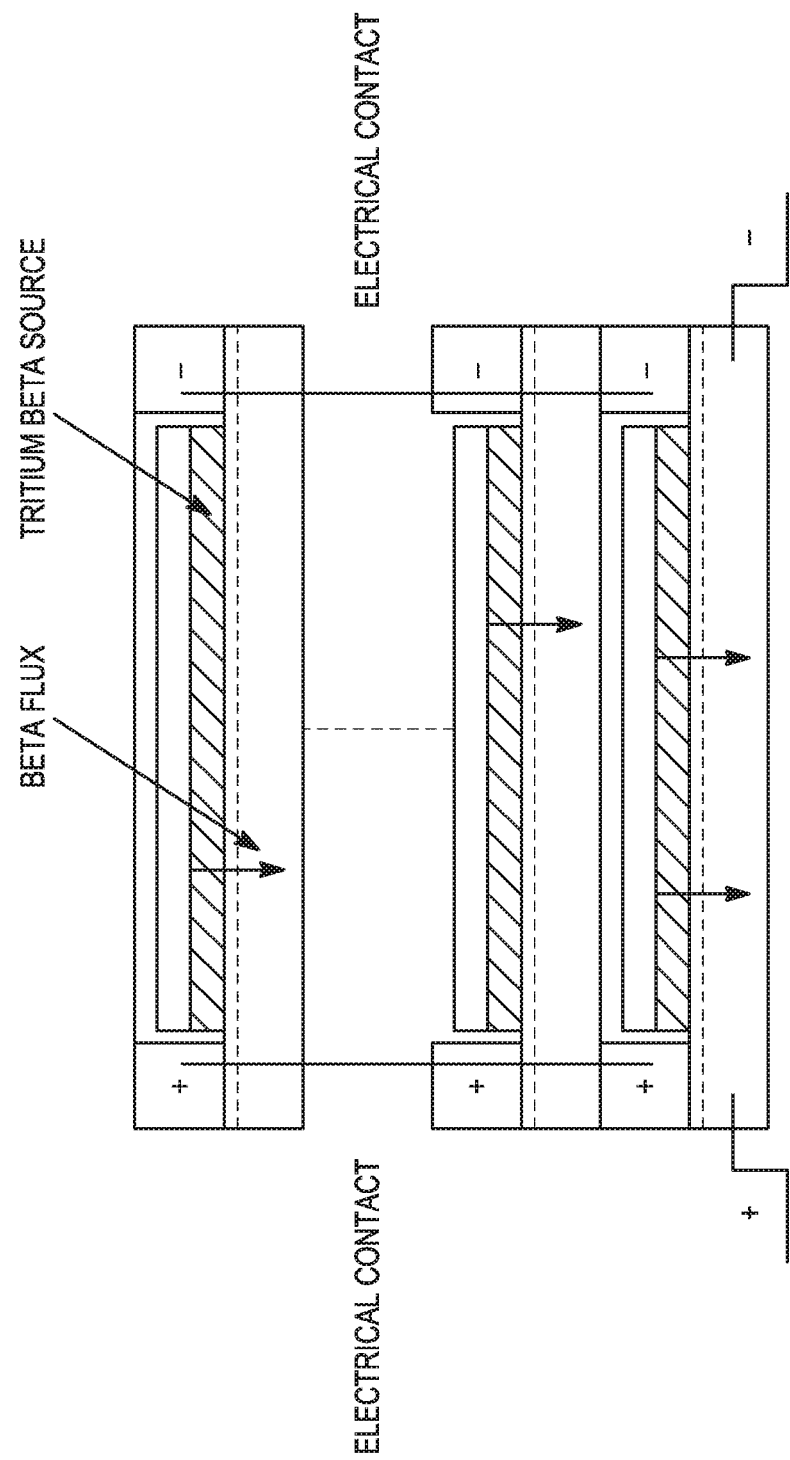
FIG. 9 illustrates a parallel connection of units that are stacked vertically comprised of unidirectional (or bi-directional) beta sources.

FIGS. 7A and 7B illustrate a novel approach for combining n/p and p/n cells in series with bidirectional beta sources, i.e., sources that emit beta particles in two directions. This approach provides efficient use of a tritium layer in a bidirectional capacity. As shown in FIG. 7A, the n and p layer dopants are reversed for the top and bottom cells, resulting in a negative polarity contact on the top surface and a positive polarity contact on the bottom surface. These contacts can be formed as discussed above for the series stack. If the cells have identical properties, except for polarity, the two-cell unit provides:

$(Isc)$unit=$Isc$, $(Voc)$unit=$2\times Voc$ and $(P\,max)$unit=$2\times P\,max$ FIGS. 8A and 8B illustrate a configuration for combining two n/p (or p/n) cells in parallel and coupled to a bidirectional source. In this case, characteristics of the two-cell unit are:

$(Isc)$unit=$2\times Isc$, $(Voc)$unit=$Voc$ and $(P\,max)$unit=$2\times P\,max$ Cells arranged in a stack but electrically connected in parallel is depicted in FIG. 9 where such a structure of n/p (or p/n) cells, where each cell is coupled to a unidirectional beta source. Assuming there are N identical cells, each having Isc, Voc, and P max as cell parameters, $(Isc)$stack=$N\times Isc$, $(Voc)$stack=$Voc$, and $(P\,max)$stack=$N\times P\,max$ The commonly-owned application Ser. No. 15/602,078 referred to above, describes several embodiments of series, parallel, and series/parallel connected configurations.

Joining techniques (both electrical and physical) for stacks of electronic components (e.g., multi-chip stacking) such as, solder connections, wire bonding, and other conductive adhesive materials and techniques, can be utilized to join combinations of the configurations listed in FIGS. 6-9. This allows for a broad variety of design interconnection, thus achieving betavoltaic batteries with a variety of current and voltage specifications.

One embodiment of the present invention includes a method of hermetically sealing a direct conversion semiconductor with tritium metal hydride sources at low temperatures. During construction of the battery and sealing of the package there is no leakage of tritium from the metal hydride, as would occur with high temperature sealing methods described elsewhere herein. Thus, this technique poses no risk of tritium exposure to the operator performing the sealing operation. Additionally, the hermetic battery design and the sealing techniques allow for high throughput manufacturing and low contamination of tritium within the manufacturing facility.

Hermetic packaging and sealing techniques for integrated circuits are widely used in the semiconductor industry to prevent dirt, moisture, particulates and ionic impurities from entering the integrated circuit package and causing corrosion of the circuit elements and interconnects. In an embodiment of the present invention a combination of these techniques and packaging designs prevents tritium from escaping the battery package. That is, the role of hermetic packaging and sealing for integrated circuits is reversed in the case of the tritium battery, that is, from contamination entering the IC package to preventing radioactive contamination from exiting the tritium battery package.

In one embodiment of the present invention, the battery package comprises a ceramic or metal housing containing electrode pins or leads extending from an internal area of the package to an external area of the package. See FIGS. 11A (external view of package), 11B (package interior with lid removed), and 11C (cross-sectional view of the package interior). The leads serve as conduits for electrical current generated by the battery. The leads are hermetically attached and sealed via glass frits or commonly used techniques for hermetic sealing of leads. Although the lead sealing methods involve high temperature processes above 300° C., the leads are sealed on the battery housing prior to containment of the tritium metal hydride.

The semiconductor device (i.e., the n/p or p/n layers described herein) and tritium metal hydride source (comprising scandium, titanium, magnesium or other suitable metal tritide candidate) is inserted into the package and connected to the leads via wire bonding or other conventional techniques. The wire bonds are not illustrated in FIGS. 11A-11C.

In one embodiment, the present invention uses a Kovar lid or a Kovar step lid that closes the tritium battery package. If a ceramic package is used a side brazed Kovar seal ring should be attached using techniques commonly known in the art. Note, the Kovar seal ring is attached prior to inserting the tritiated metal hydride.

Figures 10A, 10B:
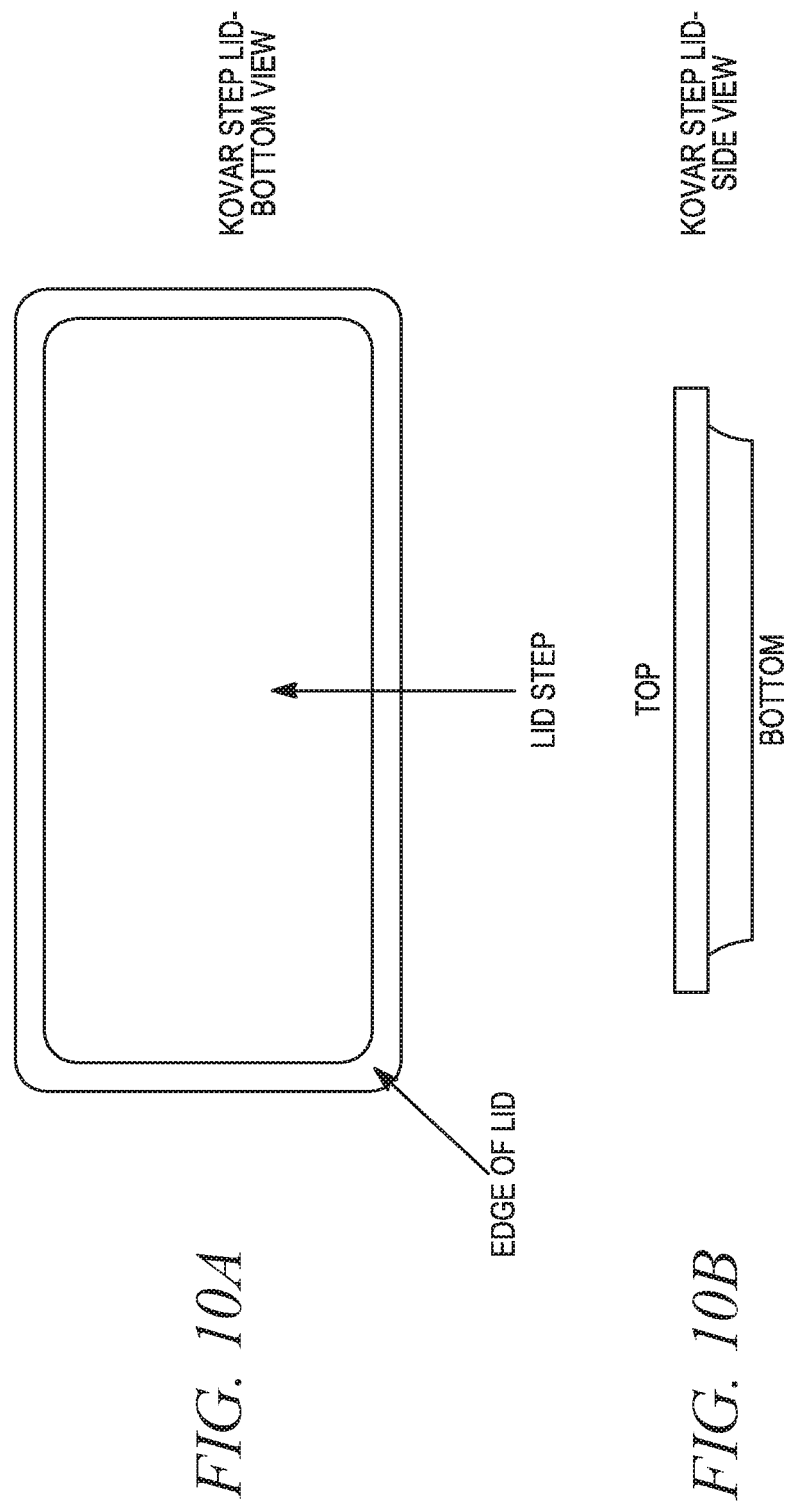
FIGS. 10A and 10B illustrate a seal lid for use with the device of the present invention.

The final step in completion of the betavoltaic cell is sealing of the Kovar step lid to the metal package or to the ceramic side-brazed package, with a Kovar seal ring. See FIGS. 10A (bottom view) and 10B (side view). FIG. 10A illustrates a lid step and a lid edge. The lid is sealed with a resistance or laser welder that uses localized heating, while the package remains well below 200° C., to hermetically weld the lid to the package. The preferred method for welding is a parallel seam welder, which is inexpensive compared to laser welding and offers a high throughput. Note, the most common method in the IC industry for hermetic sealing is the solder weld using a belt furnace. This method involves temperatures of approximately 360° C., well above the threshold for tritium containment.

The tritium battery package seal is tested by enclosing the seam-sealer and the unsealed tritium battery package within a helium glove box environment. Helium is flowed across the unsealed package and the Kovar lid is then placed on the package, trapping helium inside the package. The sealing is performed in a glove box so that the trapped helium will remain within the package. The tritium battery package is then placed in an ultra-sensitive helium detector with detection levels up to 10^-11 cc/second under a 1 atmosphere differential. A helium leak rate of 10^-8 cc/second or less, under a 1 atmosphere differential is considered a hermetic seal for the tritium battery package. Such a leak rate is easily achieved using this method. Additionally, lower hermiticity requirements are still acceptable as long as tritium leakage is within acceptable regulatory limits.

The package described herein may take any form of current IC packages, e.g., PIN device leads, leadless package, surface mounts, etc.

See commonly-owed U.S. Pat. Nos. 8,634,201 and 9,466,401 (both of which are incorporated herein in the entirety) for further details of the sealing process.

In one embodiment, the battery package is constructed from machined metal parts e.g. aluminum, steel, titanium, and is welded or brazed using techniques known to those skilled in the art to provide the hermetic seal. Electrical feedthrough(s) can be established using standard techniques in the electronics packaging industry, as described above.

There are also benefits to the operation and longevity of the betavoltaic device that are directly derived from sealing the device in an inert atmosphere. Namely, the prevention of oxidation or corrosion reactions involving both the weld joint between the lid and package, as well as oxidation that forms on the surfaces of the actual components of the betavoltaic device can be mitigated. Elimination of trapped oxygen and humidity though the use of a ultra-high-purity, very low humidity, inert gas prevents the possibility of generating an oxide product in the weld seal, which would produce an opportunity for tritium leakage out of the package, or humidity and oxygen leakage into the package.

Another approach to testing of the hermetic seal may be achieved with a helium bombing system where the tritium battery package is enclosed in high-pressure helium environment. Depending on the size of the leaks within the tritium battery package the helium gas will enter the package. The package is then removed from the high-pressure environment and inserted in the ultra-sensitive helium detector unit to detect helium leakage rates.

After a single betavoltaic cell (comprising the direct conversion semiconductor layers and the tritium metal hydride source) is formed, a plurality of such cells may be connected in series, parallel or series/parallel to achieve the desired current and/or voltage output.

In another embodiment containment of tritium and radiation emanating from the tritium metal hydride is contained within individualized tritiated direct-conversion semiconductor dies or epilayer dies. These direct-conversion dies and tritium metal hydrides can be supplied with appropriate encapsulation that serves to contain the radiation. Encapsulation in the form of discrete, conformal coatings can be applied through numerous techniques, such as dipping/immersion process, chemical/physical vapor deposition techniques, (e.g. potting, sputtering, evaporation, etc.). These coatings may be applied as thin films and can be polymeric, metallic or vitreous in nature or combination thereof, providing some modest structural support and robustness to the direct conversion dies, while still providing an important, necessary, and effective barrier to the emission of beta particles arising from tritium decay and containment of the tritium radioisotope.

Encapsulation is conducted to safeguard against any radiation leakage, but would be accomplished in a conformal manner so as to leave contact leads exposed as necessary for integration into device housings and maintain geometric requirements for the dies.

These dies thusly encapsulated are then facile candidates for regulatory general and/or exempt licensure; in this manner, the encapsulated materials could easily be transported or handled without any risk of radiation exposure and without any need for specialized radiation materials training. For example, the encapsulated tritium betavoltaic dies could be shipped to an OEM integrator for inclusion in an integrated circuit package without a hermetic seal. Encapsulated dies may be stacked or connected in series/parallel (using techniques described elsewhere herein or in the commonly-owed application Ser. No. 15/602,078 referred to above) prior to or after encapsulation.

One aspect of the present invention involves increasing the surface area per unit volume in a direct conversion device, without increasing the dark current, by using a surface texturing technique. See the commonly-owned application filed on Jun. 24, 2014, assigned application Ser. No. 14/313,953, and entitled Tritium Direct Conversion Semiconductor Device Having Increased Surface Area, which is incorporated herein.

The ELO (epi or epitaxial layer liftoff) process has been referred to above. In one embodiment, the ELO process is employed to remove an intact epilayer containing the betavoltaic semiconductor device n/p or p/n layers. The epilayer is approximately 0.1 microns to 5.0 microns thick, but can be as thick as 50 or 100 microns and is flexible. The epilayer is fabricated substantially free of surface defects that may be deleterious to the betavoltaic device and thus increase the device dark current.

Such ELO devices may provide 0.1 to 0.2 microwatts of power per $cm^2$, but the device may produce more or less power than these values, dependent on the device's active area and beta source strength. By stacking of these individual layers (as described elsewhere herein, the power density can reach as high as 100-2000 microwatts/cm^3, thereby achieving an increase in active surface area per unit volume resulting in a significant increase in power per unit volume.

Epitaxial growth of the betavoltaic junction is accomplished on a substrate using MOCVD or MBE processes. In the ELO approach the layers are grown in an inverted fashion. Thus, the backing layer (also referred to as the back side metallization or back side metal) is on a top surface. See FIG. 13A. A material of the backing layer may comprise a metallic layer (e.g. gold, copper, aluminum, titanium, scandium, platinum, silver, tungsten, and other alloys) or a polymer material (e.g. polyimide, Kapton, etc.).

The backing layer provides structure and rigidity to the betavoltaic junction layers as they are "lifted-off" from the substrate by etching of a release layer. See FIG. 13B. With this process, the substrate may be reused to grow another epilayer, thereby reducing the cost of the substrate material.

As shown in FIG. 13C, a temporary chuck/substrate is attached the back side metallization layer to provide additional rigidity during processing. The temporary chuck is removed by methods known in the art (e.g. dissolution of adhesion layer or a heat release polymer, selective etching, etc.). The hydride metallization layer is applied as illustrated in FIG. 13C.

The lifted-off betavoltaic junction cell may be further processed, tested, diced, or otherwise manipulated prior to release from the temporary chuck. See FIG. 13D depicting a plurality of betavoltaic die. In another embodiment described below, the hydride metallization layer is disposed on an exposed surface of the "back side" metallization layer in lieu of the FIG. 13D configuration where the hydride metallization layer is shown as disposed on the epitaxial layers. This configuration allows for relatively simple stacking and serial interconnecting of the die/cells.

Another fabrication technique, referred to herein as a substrate removal process is illustrated in FIGS. 14A-14D. According to this technique the junction layers are grown in an upright orientation with an etch stop added before BSFR layer possibly or before the nucleation/buffer layers. FIGS. 4 and 5 illustrate the placement of those layers.

After formation of the layers, the front or top surface of the structure is processed to create gridlines/contacts, isolation etch layer, metal deposition, etc.) prior to tritium loading. See FIG. 14A.

The substrate is removed by etching away the entire thickness of the substrate (e.g., 500 microns), stopping at the etch stop layer, leaving the epilayer betavoltaic junction, the contact metallization and the hydride metallization layers. See FIG. 14B.

Typically, a temporary chuck (see FIG. 14C) is affixed to the top surface of the wafer (i.e. surface that may contain hydride metallization or top/front contact layer) to provide rigidity and thereby prevent shriveling of the epilayers during subsequent processing. The etch stop layer shown in FIG. 14C may be retained or removed through selective etching. The back side metallization layer is formed and the temporary chuck removed.

Instead of removing the substrate using an etching process as described above, conventional substrate thinning techniques, such as mechanical grinding and polishing lapidary techniques can also be used. These lapidary techniques can thin a substrate down to about 30 microns.

Another option substrate removal process uses a combination mechanical/polishing of the wafer down to 30-50 microns combined with etching. The wafer requires support with a temporary chuck throughout the removal process.

It should be noted that the substrate referred to in the epilayer process may be undoped/insulating or doped. Typically, the substrate is doped to make a back contact to the betavoltaic cell, but in the case of a betavoltaic epilayer structure the contact may be directly made to the betavoltaic epilayer after it has been released from the substrate. The contact can be made either through a metal contact or a metal tritide acting as a contact that is connected to a doped back surface field reflector layer or a doped buffer layer. The use of undoped/insulating substrates offers a further cost reduction over use of a doped substrate.

The back side metallization layer referred to in the ELO and substrate removal processes described herein, may also serve as a source of beta particles, i.e., a metal tritide. With two beta sources the creation of EHPs within the epilayer can be approximately doubled. The effects of this doubling may be aided by the nascent thinness of the device and the long diffusions lengths of the charge carriers in InGaP and other group III-V structures, thereby allowing for betavoltaic operation for betas entering through the base layer. Conductors in such an embodiment may be formed as a grid, allowing the beta particles to pass through open regions of the grid. In the event the metal tritide is not sufficiently thick to serve as a backing layer for the device, the metal tritide can be fabricated with a greater thickness, by plating for example.

Moreover, a metal tritide formed on both sides of a betavoltaic epilayer provides a symmetric distribution of forces under thermal expansion, thereby providing improved structural integrity for the betavoltaic epilayer. As described elsewhere, the metal tritide can also be sealed with barrier layers (e.g. metallic, polymer, semiconductor, ceramic etc.) preventing the diffusion or migration of tritium or tritium species out of the metal tritide and providing shielding against radiation contamination.

In another embodiment, the combined epilayer and tritium metal hydride (comprising a thin betavoltaic device) may be stacked in series or parallel configurations as described in the commonly-owed application referred to above, that is, application Ser. No. 15/602,078.

In yet another embodiment, the tritium metal hydride may be formed on a separate thin substrate or thin foil (e.g. less than 100 microns thick) and physically attached to the epilayer to form the betavoltaic device.

The epilayer described herein may comprise a III-V semiconductor and the betavoltaic structure may have any of the constructions or combinations thereof as described herein. For example, the betavoltaic epilayer may have a p/n or n/p structure with a doped or highly doped base, and a cap layer to protect the device from oxidation.

Figure 12:
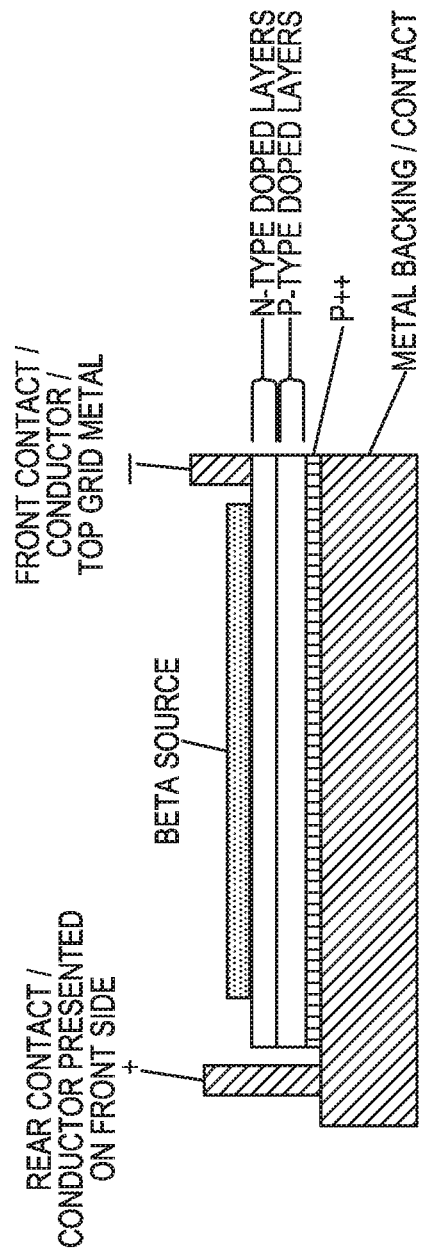
FIG. 12 illustrates a betavoltaic device with a contact/conductor presented on the front surface and electrically connected to a metal backing/contact on a rear or bottom surface of the device.

In one of the epilayer embodiments, it is also possible to establish contact to a structure on a rear surface of the ELO betavoltaic device through a top (i.e., front) surface of the device. This is accomplished by chemically etching, physically ablating, or otherwise removing semiconductor material from the top surface down to the metal backing layer contact. See FIG. 12. This creates a contact to the metal backing layer that is accessible from the top surface of the betavoltaic ELO device.

In another embodiment, an epilayer betavoltaic front contact is established to the cap layer and the rear contact (to present on the front surface of the finished device) is in contact with an opposite polarity layer (e.g., buffer, back surface field reflector, base, etc.). A portion of the top layers are chemically etched, physically ablated, or otherwise removed to expose one of the opposite-polarity layers. The exposed portion may accommodate contacts in the form of metal contacts/gridlines/ring/terminals/pads/points/epoxy(s)/solders etc.

In one embodiment, the released layers are coated on opposing faces with a radioisotope material (e.g. tritium hydride metal etc.) to allow beta flux to enter through opposing faces of the cell. This is particularly useful in cases where there is a monolithic SBU with two junctions.

It should be understood that any III-V direct conversion device may be formed into an epilayer and then released from its backing/substrate as described.

In one embodiment a bilateral betavoltaic cell may be grown on a semiconductor substrate for use in the ELO process. For instance, for either GaAs or Ge substrates a combination of a p/n and n/p betavoltaic structure (e.g. InGaP, InAlP, InAlGaP, AlGaAs, or others) may be formed yielding twice the voltage of a single-sided counterpart. The bilateral cell is released from the substrate in a similar manner to the typical ELO process. Just as in the case of a single-sided betavoltaic, each side of the bilateral ELO cell will require a source of beta flux impinging on the respective junctions. The use of tunnel junctions may be required to allow the current to flow in a series arrangement between the two betavoltaic cells.

The various embodiments of the present invention allow construction of a single flexible epilayer tritium betavoltaic battery or a very thin betavoltaic battery that comprises a plurality of tritium betavoltaic epilayer cells stacked in either a series or parallel electrical configuration. For example, a thin epilayer tritium betavoltaic battery may be constructed with either the tritium metal hydride film connected to the epilayer or directly deposited on the epilayer. A thin betavoltaic epilayer battery may be connected to a lithium ion thin film battery available from companies such as Front Edge Technologies of Baldwin Park, Calif., Cymbet Corporation of Elk River, Minn., and Infinite Power Solutions from Littleton, Colo. These two batteries may be connected together as a joint film that may be pasted within an integrated circuit package to run the device periodically via power bursts from the lithium thin film battery. The tritium epilayer betavoltaic battery can trickle charge the lithium ion film battery. Periodically the lithium film battery can discharge power bursts at milliwatt power levels and then be recharged via the trickle charging by the tritium epilayer betavoltaic battery.

The tritium epilayer battery, due to its thinness and flexibility, may be inserted into the conformal coating of an integrated circuit and stealthily power the integrated circuit. It can also be combined with a lithium ion thin film battery into the conformal coating of an integrated circuit as a source of power for the integrated circuit. The tritium epilayer battery can also be placed within an integrated circuit's package, multi-chip-module or printed circuit board or a ceramic and/or metal hermetic package.

Some of today's secure processors and field programmable gate arrays (FPGA's) are using SRAM memory to store encryption keys. However current battery technologies depend on chemistries that are unreliable over long periods of time (i.e. several years) especially under wide temperature ranges, such as −55° C. to +125° C.

The tritium betavoltaic batteries of the present invention are able to power the SRAM memory for periods of 15-20 years or more through these extreme temperatures. Note, the voltage of tritium betavoltaic batteries based on III-V compounds will fluctuate less in higher temperatures than silicon-junction based betavoltaic devices.

The tritium based betavoltaic batteries of this invention allow soldier-to-base wireless communications and computer-to-base communication to be encrypted using FPGA's with encryption keys stored in SRAM as well as defense and telecom applications that experience a wide range of temperatures. Note, the tritium betavoltaic batteries are hermetically sealed batteries packaged in surface mount packages that may be soldered to circuit board with the FPGA's Another application of tritium based betavoltaic batteries of the present invention is for supplying power to anti-tamper volume protection for electronics and other devices that require protection from intruders. These batteries provide the critical longevity of more than 10 years for anti-tamper protection. Note, the temperature resilience of these batteries is critical to the longevity and reliability. In one embodiment, a volume protection membrane from W. L. Gore is used on a circuit card to protect encryption keys stored in SRAM from a reverse engineering attack. The tritium betavoltaic batteries of this present invention may be hermetically sealed in a surface mount package and soldered on the circuit board to provide power to both the volume protection device, the anti-tamper trigger in the processor and the encryption keys held in SRAM. If an attack occurs on the volume protection device (i.e., W. L. Gore volume protection membrane), the tritium betavoltaic battery power allows the volume protection device to detect the attack and the anti-tamper trigger will erase all critical information residing in the electronics, including the encryption keys.

Several additional and advantageous ELO embodiments are described below and illustrated in the referenced figures.

The inventors have determined that the beta cell suffers certain degrading effects when metals are deposited onto the ELO layers (i.e., the p and n doped layers and related layers proximate the pn junction) via a physical vapor deposition (PVD) process (e.g. sputtering or evaporation). Sputtering is a preferred method for deposition when two or more metals are blended into an alloy, which is particularly advantageous for metal hydrides. Unfortunately, the impact of metal ions directly onto the ELO layers is detrimental to the betavoltaic cell's current/voltage properties (e.g., fill factor degradation or shunting). Although evaporation is a milder deposition process, it can in some cases also cause degradation of electrical properties due to differing thermal expansion coefficients (CTE) of the layer materials. As a result, ELO layers are torn, thereby degrading current and voltage properties of the cell and reducing the cell fill factor.

Figure 16:
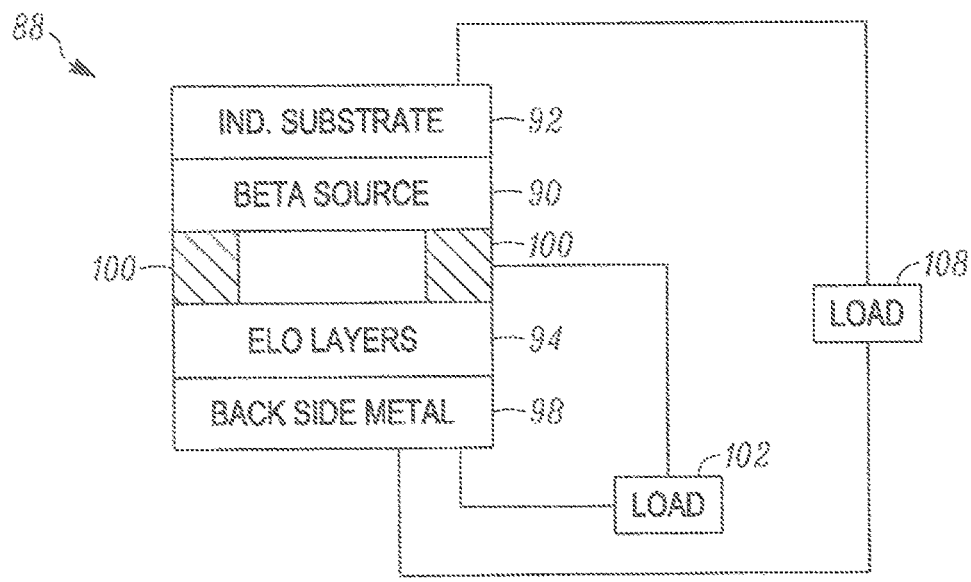
FIGS. 16, 17, and 18 illustrate three configurations of epitaxial liftoff layers relative to a beta source.

FIG. 16 illustrates a betavoltaic cell structure 88 that does not suffer these effects. A beta source 90 (e.g., in the form of hydride metallization, also referred to as metal tritide or tritide film, i.e., tritium within a metal film) is mounted on or deposited on an independent substrate 92 (e.g., a metal foil).

ELO (epitaxial liftoff) layers 94 (comprising n/p or p/n doped epi layers) are connected to a back side metal 98. Although the principle layers in the ELO structure comprise the doped base and emitter, other material layers present in various embodiments of the ELO structure include: a window layer, an intrinsic layer, a back-surface field layer, a buffer layer, a crystallization layer, and a nucleation layer. The function and material composition of each additional layer are described elsewhere herein. Further, certain embodiments may include one of more of these additional layers and other embodiments may include different ones of such additional layers. The ELO layers comprise the betavoltaic junction.

One technique for connecting the ELO layers to the back side metal 98 proceeds as follows. The inverted ELO layers are grown via MOCVD onto a GaAs wafer substrate with an intervening AlA (aluminum arsenide) release layer. The back side metal is deposited (using a combination of evaporation and electroplating) on a top surface of the wafer substrate above the inverted ELO layers. Both the back side metal layer and the ELO layers are released from the parent GaAs wafer via an HF etch of the AlA release layer.

Returning to the embodiment of FIG. 16, conductive contacts 100 are in electrical contact with an uppermost layer of the ELO layers 94, which may be an n-doped layer or a p-doped layer. In either configuration, a lowermost layer of the ELO structure, in conductive contact with the back side metal 98, comprises an oppositely doped region, i.e., a p-doped layer or an n-type doped layer. Thus, a load 102 may be connected between the back side metal 98 and the contacts 100, as illustrated. Generally, when used in the present written description, references to two elements in conductive contact refers to the ability of a current to pass through the two elements, which may be in physical contact, separated by conductive material, or sufficiently close to allow current to pass therethrough. Also, generally when used herein the terms uppermost and lowermost refer to stacked layers when in a vertical orientation, with a layer characterized as uppermost referring to the top or upper layer within the stack, or a first layer above (i.e., uppermost) relative to a second layer. And a lowermost layer refers to the bottom or lower layer within the stack, or a first layer below (i.e., lowermost) relative to a second layer.

The contacts 100 block the beta particles emitted by the beta source, but preferably the contacts cover only a small percentage of the total active area of the ELO layers and thus the effect is not significant.

Since the beta source layer 90 and the independent substrate 92 can, in one embodiment both be constructed from a conductive material, in such an embodiment a load 108 may be connected between the back side metal 98 and the independent substrate 92. Additional contact placement regions are possible for extracting current from the betavoltaic cell structure 88. These additional contact placement regions are in conductive contact with the p and n regions of the ELO layers 94.

Any of these conductive components, i.e., the independent substrate (sometimes implemented as a metal foil), the contacts, and the back side metal, may serve to electrically connect multiple cells in a series or parallel arrangement, as more fully described herein. In an embodiment wherein the beta source is implemented as a metal tritide film, the tritide film can also serve as a conducting medium that supports current flow.

Figure 17:
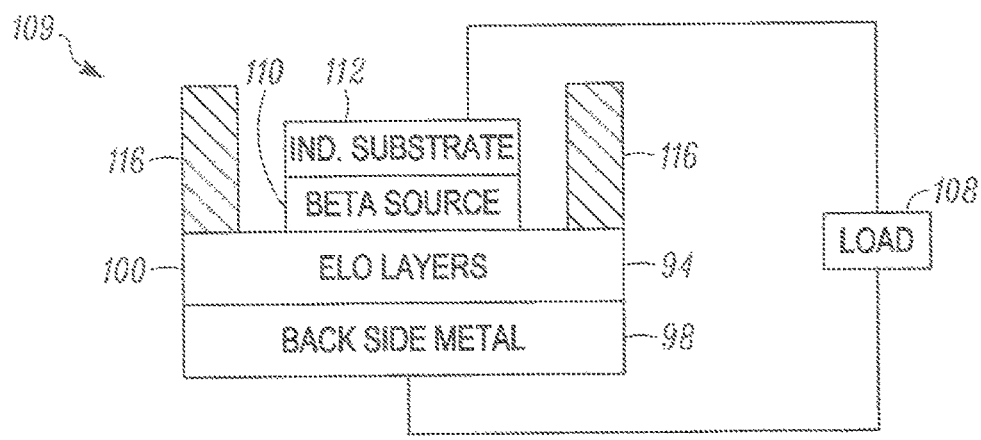

In the embodiment of FIG. 17, a betavoltaic cell 109 comprises a beta source 110 having a first surface that is first attached (as described elsewhere herein) to an independent substrate 112 (e.g., a metal foil) and then a second opposing surface of the beta source is attached to the ELO layers 94. This sequence, with the beta source attached first to the independent substrate and then to the ELO layers, avoids the PVD problems described above. Alternatively, the beta source is attached to the back side metal as described below in conjunction with FIG. 18.

In one embodiment the independent substrate 112 comprises a metal foil and the beta source 110 comprises a metal film hydride with tritium. The beta source/metal film is attached to the independent substrate 112 via a PVD process (preferably sputtering). However, the independent substrate/beta source is "attached" to the ELO layers 94 by physical compression (the preferred approach). In another embodiment the independent substrate and beta source are attached using epoxy or another adhesive or a welding process, etc.

Contacts 116 are in conductive contact with and extend upwardly from the ELO layers 94. As in the FIG. 16 embodiment, the load 108 is connected between the independent substrate 112 and the back side metal 90 for receiving current supplied by the betavoltaic cell 109. The polarity of the connections to the load can be reversed by reversing the dopant types in the ELO layers 94.

In other embodiments, contacts for carrying current generated within the ELO layers can comprise the contacts 116 and the beta source 110, since both are in conductive contact with the ELO layers 94.

The contacts 116 can also be used for interconnecting a plurality of the cells 109 in a parallel or serial arrangement as described elsewhere herein.

Figure 18:
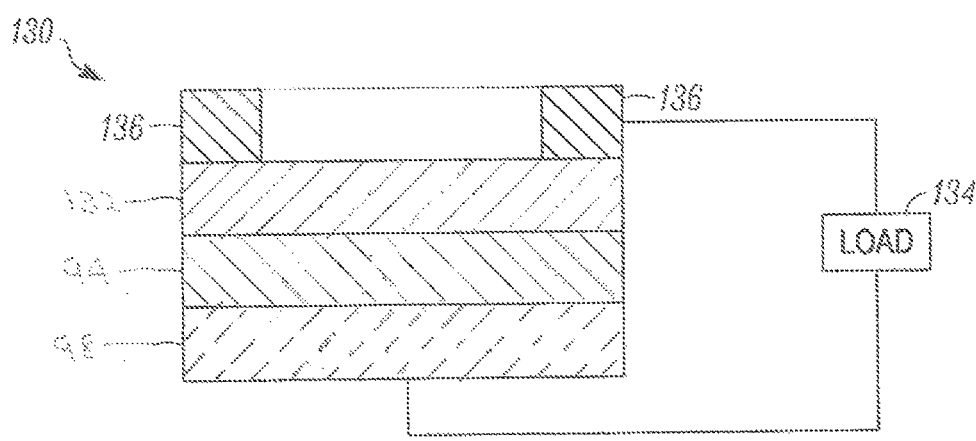

In the cross-sectional view of FIG. 18, a betavoltaic cell 130 comprises a conductive ring 136 overlaying a conductive beta source 132, that in turn overlays the ELO layers 94 and the back side metal layer 98. Since the back side metal 98 comprises a conductive material and in this embodiment the beta source 132 is also conductive, a load 134 can be connected between the conductive ring 136 and the back side metal 98.

Since the conductive ring 136 is exposed on exterior facing surfaces of the cell 130, they can be used to connect cells in series or parallel to form a betavoltaic battery.

Figure 19:
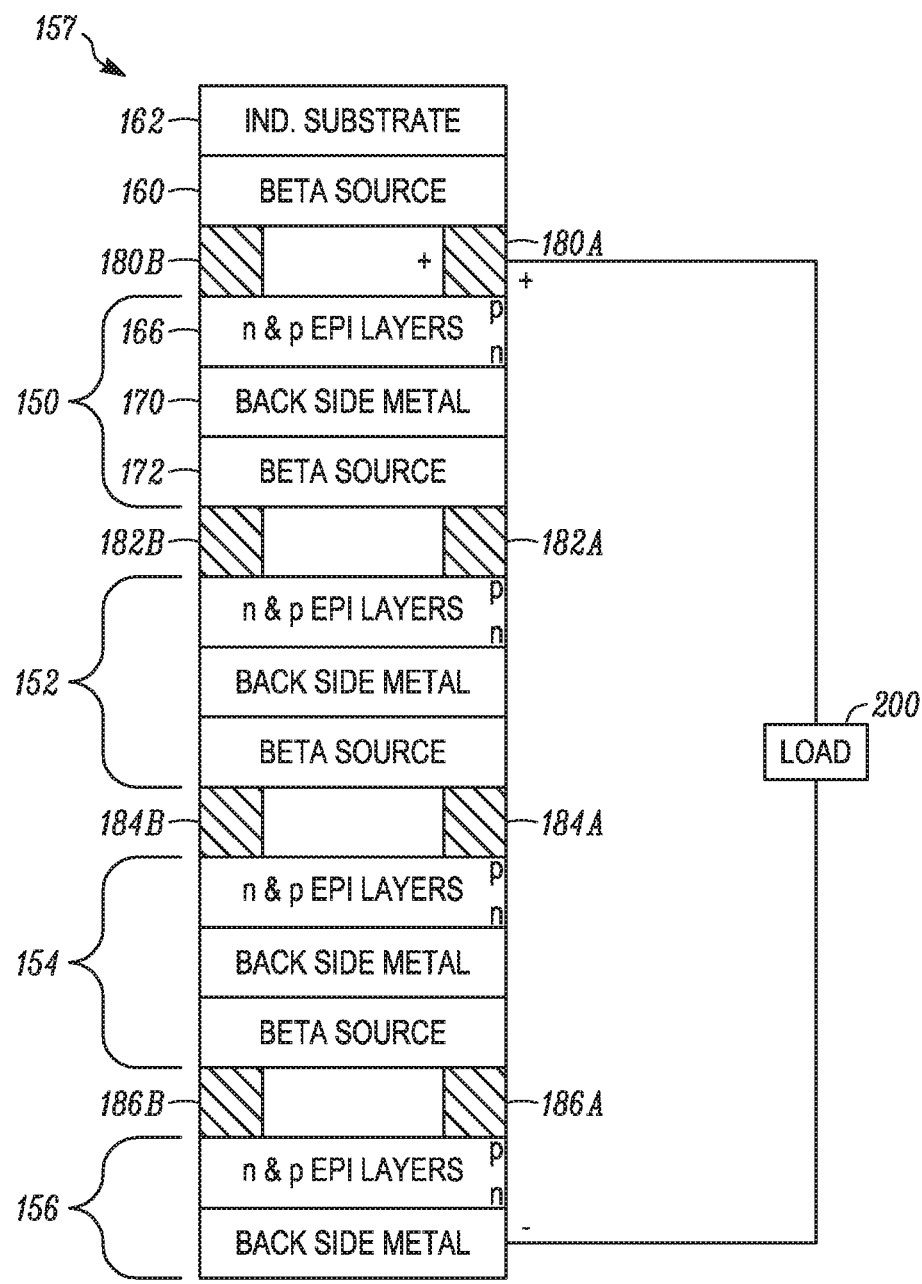
FIG. 19 illustrates a serial electrical connection of four cells, each comprising an epitaxial liftoff layer and a beta source.

FIG. 19 illustrates a series connection of four cells 150, 152, 154, and 156, forming a betavoltaic battery 157. For the uppermost cell a beta source 160 is attached to an independent substrate 162. Aside from the uppermost cell that includes the independent substrate 162, each cell is configured with a beta source, two laterally disposed contacts, a plurality of n-doped and p-doped ELO layers (with those layers more fully described in other embodiments set forth herein, and possibly additional layers as described in conjunction with the other embodiments) and a back side metal layer. Both the back side metal layer and the beta source are conductive.

A series connection of cells requires connecting a positive terminal of one cell to a negative terminal of an adjacent cell. Thus, in the FIG. 19 embodiment, the n and p-doped regions within each epitaxial layer are oriented with an uppermost p-doped layer and a lowermost n-doped layer. This configuration is not required as the n and p doped regions can be inverted.

The cells 150 and 152 are connected via contacts 182A and 182B, connecting the n-doped lowermost region of the epitaxial layers of the cell 150 to an uppermost p-doped layer of the cell 152 (through a conductive back side metal layer 170 and beta source 172). Similarly, contacts 184A and 184B connect a lowermost n-doped layer of the cell 152 to an uppermost p-doped layer of the cell 154. A lowermost n-doped layer of the cell 154 is connected to a p-doped uppermost layer of the cell 156 through contacts 186A and 186B and through the back side metal layer and the conductive beta source of the cell 154.

Therefore, a contact 180A (and a contact 180B) is a positive terminal contact, as labelled in FIG. 19, and connected to a load 200. A lowermost n-doped layer of the cell 156 is connected to the load 200, operating as the negative terminal of the betavoltaic battery through the back side metal layer.

In the various embodiments depicted, the structures referred to as contacts can be implemented as contact pads, contact grids/lines, conductive pillars, conductive posts, conductive blocks, conductive vertical structures, conductive columns, conductive surfaces, or any other conductive shape suitable for collecting the charged carriers and carrying current to other conductive components. Also, in the various embodiments where two conductive elements or conductive layers are described as in conductive contact, the two elements may be in physical contact and therefore in conductive contact or the two elements may be separated by conductive material in physical contact with both elements.

In any of the presented embodiments, the layers of the various structures can be physically compressed by application of a compressive force to create an electrically conductive structure. The layers can also be soldered, welded, or connected via a silver epoxy material, etc. The inventors have determined that the most volumetrically efficient structure results from physically compressing the layers into a unified structure.

In the various embodiments the back side metal may be capped with a gold film and the metal tritide (beta source) may be is capped with a palladium film. Both are noble metals and serve as good electrical contacts.

Figure 20:
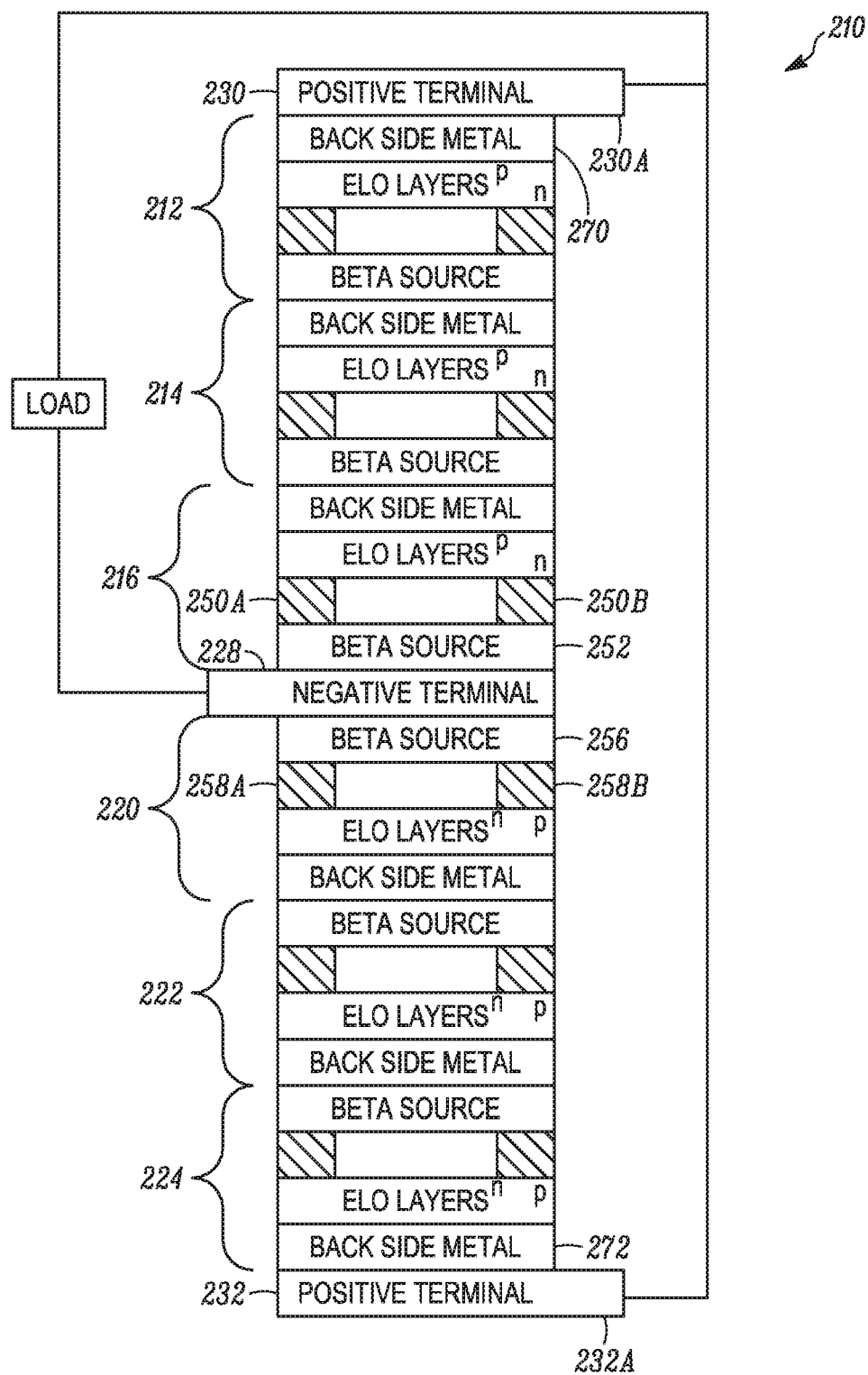
FIG. 20 illustrates a parallel electrical connection of two cells according to FIG. 19.

FIG. 20 illustrates a betavoltaic battery 210 comprising three series-connected betavoltaic cells 212, 214, and 216 that in turn are connected in parallel with three-series connected cells 220, 222, and 224.

Note that as illustrated, the p-doped region is the uppermost doped region in the cells 212, 214, and 216. The n-doped region is the uppermost doped region in the cells 220, 222, and 224. Thus, each of the cells can be fabricated according to the same process sequence, with the cells 220, 222, and 224 flipped upside-down relative to the cells 212, 214, and 216 to form the parallel connection.

A negative terminal 228 of the battery is connected to n-doped regions of the cell 216 (through conductive contacts 250A and 250B and a beta source 252, with the n-doped region on a bottom surface) and the cell 220 (through conductive contacts 258A and 258B and a beta source 256, with the n-doped region on a top surface).

Positive terminals 230 and 232 are connected to p-doped regions of the cell 212 (with the p-doped region on a top surface) and the cell 224 (with the p-doped region on a bottom surface) via back side metal layers 270 and 272. The positive terminals can be connected together using a wire bonding process or spot welding of extending tabs 230A and 232A. Note that in FIG. 20 (and all figures herein) the illustrated layers are not drawn to scale and are much thinner in an operating device, which allows the extending tabs to be easily spot welded together.

In the FIG. 20 embodiment, neither of the positive terminals 230 and 232 nor the back side metal layers to which each is connected is attached to a beta source, unlike the other back side metal layers in the battery 210.

However, the negative terminal 228 is conductively connected to n-doped regions of the cells 216 and 220 (within the ELO layers) via the respective conductive beta source layers 252 and 256, as described above. In certain embodiments described and illustrated herein, the beta source layer comprises a thin metal tritide film.

In FIG. 20 the negative terminal 228 comprises a metal foil or another type of conductive substrate.

Although FIG. 20 depicts a parallel connection of two batteries, each with three series-connected cells, the arrangement is scalable to any number of series connected cells in each battery, any number of parallel-connected batteries, and multiple stacks of the parallel batteries.

Various layers are described herein as having a p-type dopant or an n-type dopant. Those skilled in the art recognize that the dopant types can be reversed (n-type doped layers replaced with p-type and p-type doped layers replaced with n-type) and the device will provide the same functionality. Various layer thicknesses in the figures may be exaggerated for clarity. The illustrated layer thickness and the relative thickness among the layers may not be illustrative of actual layer thickness in an operational product.

Dopant concentrations are given for certain embodiments. The superscripts + and ++ designate dopant concentrations that are greater than (+) and much greater than (++) conventional dopant concentrations. However, those skilled in the art recognize that different dopant concentrations may be utilized to produce a functional radioisotope-based direct energy conversion battery. In one sense the dopant concentrations are relative and dependent on the semiconductor material.

Also, certain embodiments have been described as having an intrinsic layer; depending on the dopant types, doping levels, and other factors, this intrinsic layer may not be required in all embodiments. In the Tables presented, the intrinsic layer is sometimes referred to as the "i-layer."

This written description uses examples to disclose the invention, including the best mode, and also to enable any person skilled in the art to make and use the invention. The scope of the invention may include other examples that occur to those skilled in the art. Such other examples are intended to be within the scope of the claims if they have structural elements that do not differ from the literal language of the claims, or if they include equivalent structural elements with insubstantial differences from the literal languages of the claims.

In addition to the described embodiments and the layers comprising those embodiments, it should be noted that other embodiments of the invention may comprise one or more material layers from one of the described embodiments used with one or more material layers from other ones of the described embodiments.

In one embodiment, an alpha-radiation-emitting source can be utilized in lieu of a beta-emitting source, resulting in an alpha-voltaic that may make use of one or more of the configurations described herein.

Another embodiment may comprise any combination of radioisotope sources in a single package, giving rise to combinations of alpha-, beta-, and gamma-voltaics. It should be noted that some choices of radioisotopes may provide decay products that include radioisotopes that emit the same or different types of radiation energy.

In one embodiment, the source may also be one which emits electrons as a secondary source (e.g. a particle strikes the source and the resultant emission comprises electrons). In addition, other radioisotopes or combinations of radioisotopes and/or substrates whose end-product is an electron or beta particle that impinges on the semiconductor may be utilized. The source may also be of a type that is intended to be attenuated to appropriate energy levels through the use of a barrier/filter.

In any of the embodiments above, the beta source can be substituted with an assembly that utilizes a radiation source impinging on a scintillating material for the purpose of generating photons that are captured by the cells. These radioisotope-indirect conversion devices can take the place of the beta source in the device and generate photon emissions as well as transmit radioactive alpha, beta, or gamma emissions that may be captured by the junctions.

What is claimed is:
1. A device for producing electricity, comprising:
a first device, comprising in a stacked relationship:
a first conductive radioisotope source having first and second oppositely disposed surfaces;
an independent conductive substrate overlying and in contact with the first surface of the first conductive radioisotope source;
a plurality of second devices, each comprising in a stacked relationship:
a second conductive radioisotope source having oppositely disposed first and second surfaces;
a second back side metal layer overlying and in conductive communication with the first surface of the second conductive radioisotope source;

second epitaxial liftoff (ELO) layers comprising n doped layers and p doped layers, the second epitaxial liftoff layers overlying and in conductive communication with the second back side metal layer;

a second conductive region in conductive communication with an uppermost layer of the second epitaxial liftoff layers;

a third device, comprising:

a third back side metal layer;

third epitaxial liftoff layers comprising n doped layers and p doped layers, the third epitaxial liftoff layers overlying and in conductive contact with the third back side metal layer;

a third conductive contact region in conductive communication with an uppermost layer of the third epitaxial liftoff layers and in conductive communication with the second conductive radioisotope source in a lowermost device of the stacked plurality of second devices; and the second conductive region in an uppermost device of the stacked plurality of second devices in conductive contact with the second surface of the first conductive radioisotope source.

2. The device of claim 1, the electricity for supplying to a load or for storing in a storage device.

3. The device of claim 1, wherein the first and second conductive regions each comprises a conductive ring.

4. The device of claim 1, wherein the first and the second conductive contact regions each comprise contact pads, contact grids/lines, conductive pillars, conductive posts, conductive blocks, conductive vertical structures, conductive columns, conductive surfaces, or another conductive structure for carrying current.

5. The device of claim 1 wherein current flows within a completed circuit between the independent conductive substrate, or the first radioisotope source, or the second conductive region, or a doped material layer within the uppermost layer of the second epitaxial liftoff layers, and the third back side metal layer, the current generated by action of radioisotope particles or gamma rays generated by the radioisotope sources.

6. The device of claim 1, wherein the second and third epitaxial liftoff layers further comprise one or more of a p-doped layer and an n-doped layer forming a junction, a back surface field reflector layer, a window layer, a cap layer, and a crystal lattice matching layer.

7. The device of claim 1, wherein particles or gamma rays emitted by the first and second conductive radioisotope sources create electron-hole pairs in the respective second and third epitaxial liftoff layers, and wherein the conductive radioisotope source comprises a beta source, further comprising tritium, nickel-63, promethium-147, tritium metal hydride, or a polymer containing tritium.

8. The device of claim 1, wherein a material of the n doped layers and the p doped layers comprises GaAs, InAlP, InGaP, InAlGaP, or AlGaAs.

9. A battery for producing electricity comprising a first device according to claim 1 connected in parallel to a second device according to claim 1.

* * * * *